US008106507B2

(12) United States Patent
Hirai

(10) Patent No.: US 8,106,507 B2
(45) Date of Patent: Jan. 31, 2012

(54) SEMICONDUCTOR PACKAGE HAVING SOCKET FUNCTION, SEMICONDUCTOR MODULE, ELECTRONIC CIRCUIT MODULE AND CIRCUIT BOARD WITH SOCKET

(75) Inventor: Yukihiro Hirai, Koganei (JP)

(73) Assignee: Advanced Systems Japan Inc., Tokyo (JP)

( * ) Notice: Subject to any disclaimer, the term of this patent is extended or adjusted under 35 U.S.C. 154(b) by 811 days.

(21) Appl. No.: 11/913,352

(22) PCT Filed: Apr. 19, 2006

(86) PCT No.: PCT/JP2006/308194
§ 371 (c)(1),
(2), (4) Date: Sep. 11, 2008

(87) PCT Pub. No.: WO2006/120849
PCT Pub. Date: Nov. 16, 2006

(65) Prior Publication Data
US 2009/0067135 A1    Mar. 12, 2009

(30) Foreign Application Priority Data

May 2, 2005  (JP) ................................. 2005-134618
Jun. 3, 2005  (JP) ................................. 2005-163950

(51) Int. Cl.
*H01L 23/34* (2006.01)
*H01L 23/02* (2006.01)
(52) U.S. Cl. .. 257/726; 257/690; 257/686; 257/E23.078
(58) Field of Classification Search .................. 257/726, 257/690, 686, E23.078
See application file for complete search history.

(56) References Cited

U.S. PATENT DOCUMENTS

| 5,086,337 | A  | * | 2/1992  | Noro et al. ..................... 257/726 |
| 5,173,055 | A  | * | 12/1992 | Grabbe ............................. 439/66 |
| 5,414,298 | A  | * | 5/1995  | Grube et al. .................. 257/690 |
| 5,973,394 | A  | * | 10/1999 | Slocum et al. ................ 257/690 |
| 6,229,320 | B1 | * | 5/2001  | Haseyama et al. ....... 324/750.25 |
| 6,303,997 | B1 |   | 10/2001 | Lee |
| 6,388,333 | B1 |   | 5/2002  | Taniguchi et al. |

(Continued)

FOREIGN PATENT DOCUMENTS

JP  H04-025161  1/1992
(Continued)

OTHER PUBLICATIONS

Notification of Reasons for Refusal from the Japan Patent Office, Japan Patent Application No. 2005-163950, Aug. 5, 2008, 6 Pages. (unverified translation).

*Primary Examiner* — Nitin Parekh
(74) *Attorney, Agent, or Firm* — Fenwick & West LLP

(57) ABSTRACT

Disclosed is a semiconductor package 3 including a socket 1 which is formed on the top surface 3a for enabling electrical conductivity and a connecting terminal 2 which is formed on the bottom surface 3b for enabling electrical conductivity. The socket 1a has a depressed shape, and a spiral contact 1 is formed in the depression 1c. An electronic circuit module is constructed by mounting and electrically connecting a semiconductor module wherein a plurality of semiconductor packages 3 is stacked on a circuit board. A circuit board with sockets is constructed by mounting a socket board on a circuit board.

5 Claims, 15 Drawing Sheets

U.S. PATENT DOCUMENTS

| | | | |
|---|---|---|---|
| 6,821,129 B2 * | 11/2004 | Tsuchiya | 439/66 |
| 7,049,693 B2 * | 5/2006 | Canella | 257/690 |
| 7,759,161 B2 * | 7/2010 | Tanaka et al. | 438/106 |
| 2002/0016090 A1 * | 2/2002 | Haba et al. | 439/70 |
| 2002/0037657 A1 | 3/2002 | Hirai et al. | |
| 2004/0256709 A1 * | 12/2004 | Hashimoto | 257/686 |
| 2007/0045804 A1 * | 3/2007 | Lin et al. | 257/686 |

FOREIGN PATENT DOCUMENTS

| | | |
|---|---|---|
| JP | H11-243174 | 9/1999 |
| JP | 2001-223297 | 8/2001 |
| JP | 2002-175859 | 6/2002 |
| JP | 2003-078078 | 3/2003 |
| JP | 2004-327855 | 11/2004 |
| JP | 2005-353543 | 12/2005 |

* cited by examiner

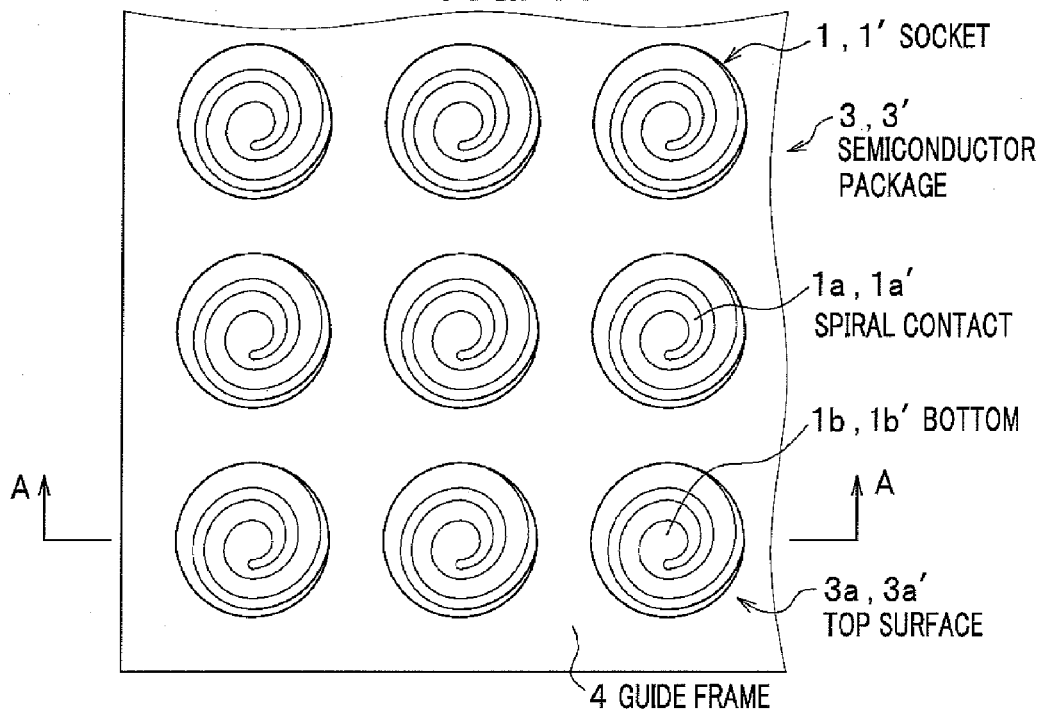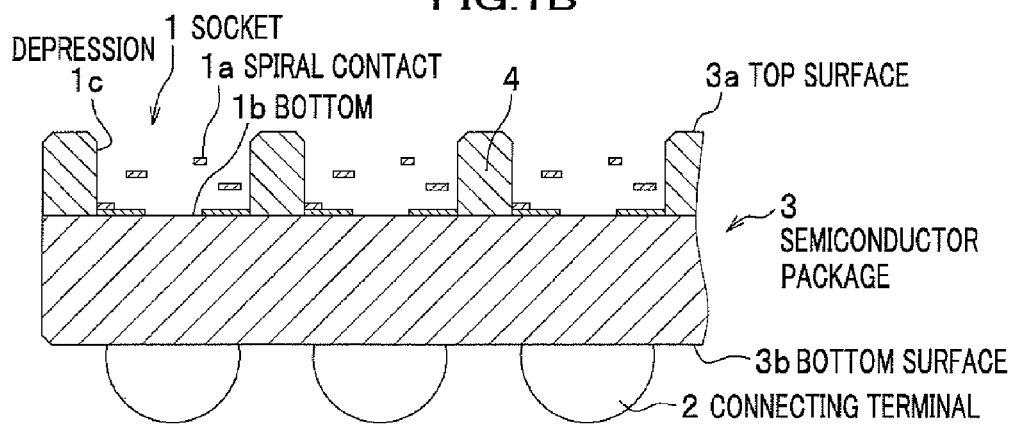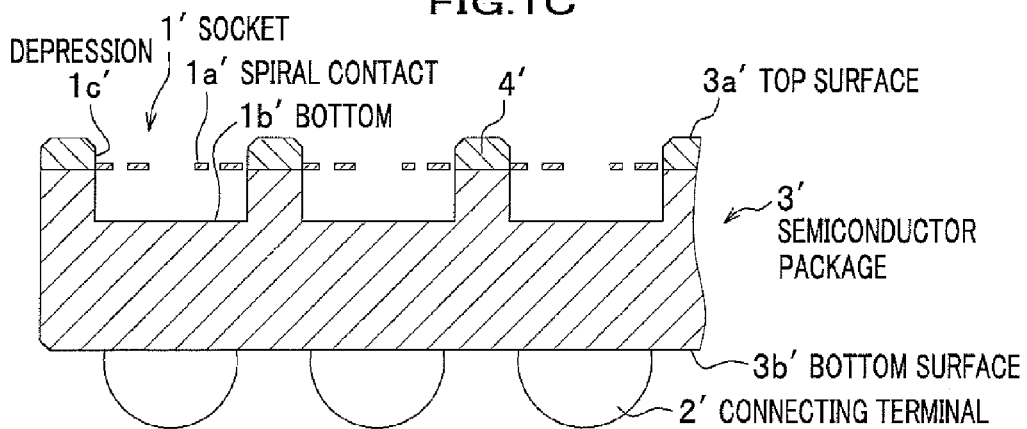

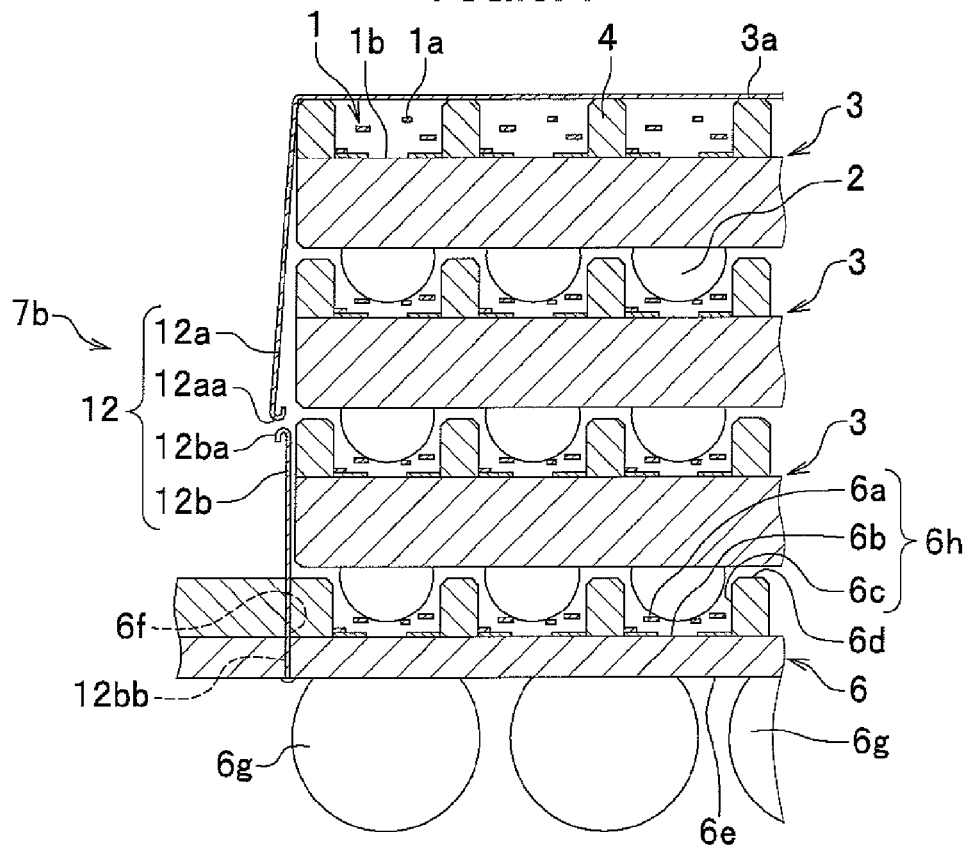
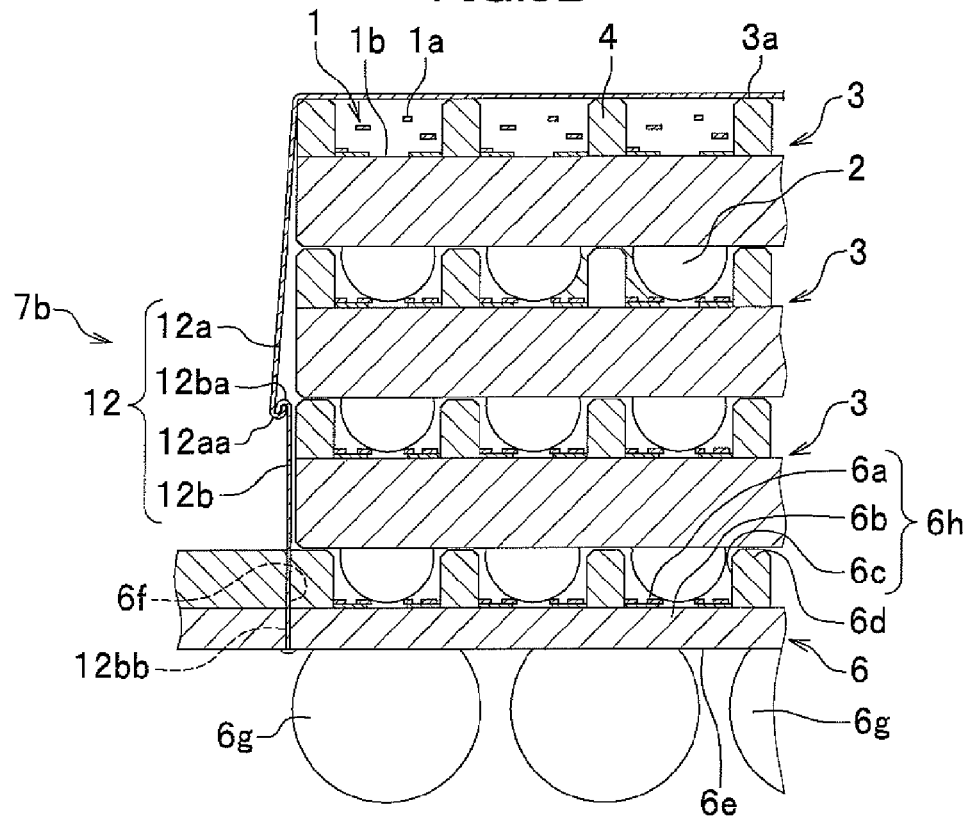

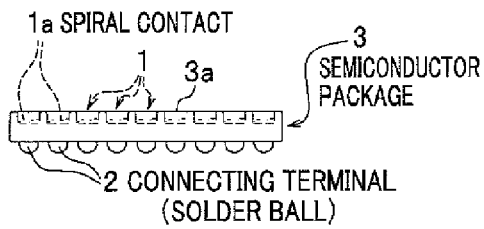
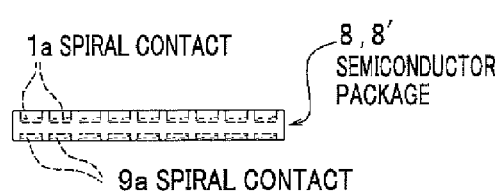
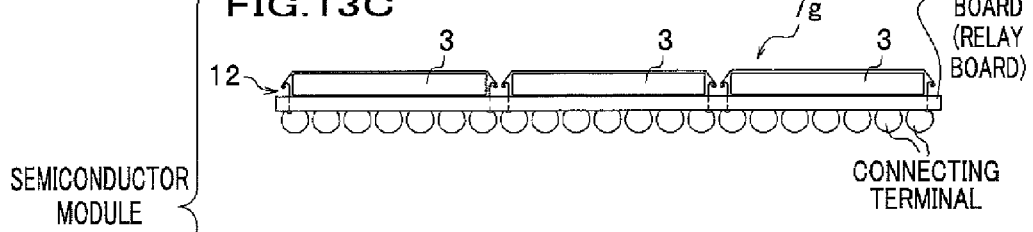
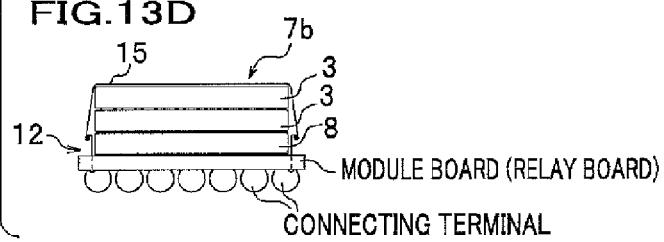
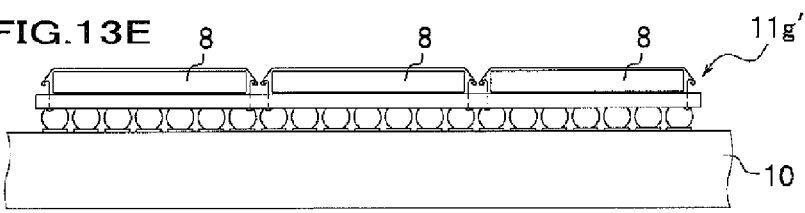
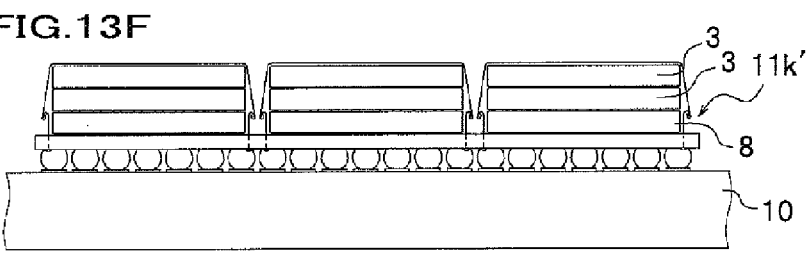

ELECTRONIC CIRCUIT MODULE

SEMICONDUCTOR PACKAGE HAVING SOCKET FUNCTION, SEMICONDUCTOR MODULE, ELECTRONIC CIRCUIT MODULE AND CIRCUIT BOARD WITH SOCKET

This application is the National Stage of International Application No. PCT/JP2006/308194, filed Apr. 19, 2006, which claims priority to Japan Patent application No. 2005-134618, filed on May 2, 2005 and Japan Patent Application No. 2005-163950, filed on Jun. 3, 2005, which are incorporated by reference in their entirety.

FIELD OF THE INVENTION

The present invention relates to a semiconductor package having a socket function, a semiconductor module wherein the semiconductor packages are stacked one above the other and/or disposed side by side, an electronic circuit module constructed by mounting the semiconductor module on a circuit board, and a circuit board with a socket.

BACKGROUND ART

A stack semiconductor device wherein a plurality of semiconductor devices is stacked and bonded by connecting terminals which are provided on the bottoms of thin semiconductor device packages and formed of solder balls has been conventionally known as an example of stack semiconductor devices. Such a stack semiconductor device is described below with reference to U.S. Pat. No. 6,303,997 (refer to pages 5, 6 and FIG. 3). FIG. 17 is a structural drawing of such a stack semiconductor device. A Semiconductor chip 51 is bonded to an inner lead 53 by adhesive agent 52. The inner lead 53 is electrically connected to an integrated circuit (not shown) formed in the semiconductor chip 51 by being wire bonded to an input and output pad 54 of the semiconductor chip 51 by a bonding wire 54. Furthermore, the device is sealed by resin 56. A solder ball 57 is provided on the bottom surface of the inner lead 53 as a connecting terminal which connects the semiconductor package 50 to an external component. The solder ball 57 is soldered to a connecting surface 58 provided on the top surface of the inner lead 53. Thus, a plurality of semiconductor packages 50 is bonded to each other by the solder ball 57, and stacked in layers, whereby a stack semiconductor package 200 is constructed.

DISCLOSURE OF THE INVENTION

However, when the semiconductor devices are stacked and electrically bonded to each other, it has been necessary to heat the semiconductor devices to melt solder. There has been a problem that the heating adversely affects a part which has been already bonded.

The present invention is made in view of the above problems and an object thereof is to provide a semiconductor package having a socket function, a semiconductor module, an electronic circuit module, and a circuit board with a socket that enable to electrically bond the semiconductor packages securely and stack the semiconductor packages without heating.

In a first aspect of the present invention, there is provided a semiconductor package comprising a socket formed on the top surface of the semiconductor package for enabling electrical conductivity and a connecting terminal formed on the bottom surface of the semiconductor package for enabling electrical conductivity, wherein the socket has a depressed shape, and a spiral contact is formed in the depression. Generally, a semiconductor package incorporates a semiconductor chip; however, the semiconductor package may not incorporate the semiconductor chip.

In accordance with the semiconductor package, because the semiconductor package comprises the socket formed on the top surface of the semiconductor package for enabling electrical conductivity and the connecting terminal formed on the bottom surface of the semiconductor package for enabling electrical conductivity, wherein the socket has the depressed shape, and the spiral contact is formed in the depression, the socket and the connecting terminal can be detachably connected to each other and can be electrically bonded securely without heating, whereby the semiconductor packages can be stacked.

In the aforementioned semiconductor package, an insulating guide frame which guides the connecting terminal may be provided around the spiral contact.

In accordance with the semiconductor package, because the insulating guide frame which guides the connecting terminal is provided around the spiral contact, the position of the socket and the connecting terminal can be easily determined, and the socket and the connecting terminal can be electrically bonded securely without heating, whereby the semiconductor packages can be stacked.

In the aforementioned semiconductor package, the spiral contact may be formed in conic shape projecting upward from the bottom of the depression.

In accordance with the semiconductor package, because the spiral contact is formed in conic shape projecting upward from the bottom of the depression, the socket and the connecting terminal can be readily connected to each other and can be electrically bonded securely without heating, whereby the semiconductor packages can be stacked.

The aforementioned semiconductor package may further comprise at least one protruding engaging portion on the top surface and at least one engaging depression on the bottom surface, wherein when a plurality of the semiconductor packages is stacked one above the other the engaging depression of the semiconductor package located relatively upper is fit to the protruding engaging portion of the semiconductor package located relatively lower. The protruding engaging portion and the engaging depression may be formed vice-versa. The shape of the engaging depression is formed to be able to receive the shape of the protruding engaging portion. The shape of the protruding engaging portion may be trigonal pyramid, polygonal cone, circular cylinder, polygonal cylinder and other shapes. The shape of the engaging depression is not limited.

In accordance with the semiconductor package, because the semiconductor package comprises at least one protruding engaging portion on the top surface and at least one engaging depression on the bottom surface, wherein when a plurality of the semiconductor packages is stacked one above the other the engaging depression of the semiconductor package located relatively upper is fit to the protruding engaging portion of the semiconductor package located relatively lower, the position of the socket and the connecting terminal can be easily determined, and the socket and the connecting terminal can be electrically bonded securely without heating, whereby the semiconductor packages can be stacked.

In the aforementioned semiconductor package, a plurality of the semiconductor packages may be stacked and a holding member may hold the plurality of the stacked semiconductor packages to a substrate.

In accordance with the semiconductor package, because the plurality of the semiconductor packages is stacked and the holding member holds the plurality of the stacked semiconductor packages to the substrate, the socket and the connecting terminal can be readily fixed and can be electrically bonded securely without heating, whereby the semiconductor packages can be stacked.

In the aforementioned semiconductor package, depressions which engage a c-shaped holding member comprising claw hooks at both ends of the holding member may be provided at both ends of the bottom surface of the semiconductor package.

In accordance with the semiconductor package, because the depressions which engage the c-shaped holding member comprising the claw hooks at both ends of the holding member are provided at both ends of the bottom surface of the semiconductor package, the socket and the connecting terminal can be readily fixed and can be electrically bonded securely without heating, whereby the semiconductor packages can be stacked.

The aforementioned semiconductor package may further comprise at least one insertion hole through which a pin holding member is inserted in a vertical direction of the semiconductor package.

In accordance with the semiconductor package, because the semiconductor package comprises at least one insertion hole through which the pin holding member is inserted in the vertical direction of the semiconductor package, the position of the socket and the connecting terminal can be easily determined, and the socket and the connecting terminal can be electrically bonded securely without heating, whereby the semiconductor packages can be stacked.

In another aspect of the present invention, there is provided a semiconductor module wherein a plurality of any one type of the aforementioned semiconductor packages is stacked and electrically connected to each other.

In accordance with the semiconductor module, because the semiconductor packages are stacked in plural and electrically connected to each other, the position of the socket and the connecting terminal can be easily determined, and the socket and the connecting terminal can be electrically bonded securely without heating, whereby the semiconductor module can be constructed.

The aforementioned semiconductor module may further comprise a semiconductor package located at the bottom of the semiconductor module, a relay connector which is provided on the bottom of the semiconductor package and relays electric connection, and a substrate comprising a land terminal which is in contact with the relay connector and electrically connected to the relay connector on the top surface of the substrate, wherein the relay connector has a depressed shape and a spiral contact is formed in the depression in conic shape projecting upward from the bottom of the depression. The substrate corresponds to a relay board and a circuit board in the preferred embodiments. The land terminal corresponds to a land terminal and a land which are provided with the relay board and the circuit board in the preferred embodiments.

In accordance with the semiconductor module, because the semiconductor module comprises the semiconductor package located at the bottom of the semiconductor module, the relay connector which is provided on the bottom of the semiconductor package and relays electric connection, and the substrate comprising the land terminal which is in contact with the relay connector and electrically connected to the relay connector on the top surface of the substrate, wherein the relay connector has the depressed shape and the spiral contact is formed in the depression in conic shape projecting upward from the bottom of the depression, the relay connector and the land terminal or a terminal of a circuit board (also referred to as a land) can be readily positioned and electrically bonded securely without heating, whereby the semiconductor module and an electronic circuit module can be constructed.

The aforementioned semiconductor module may further comprise a semiconductor package located at the bottom of the semiconductor module, a connecting terminal which is provided on the bottom of the semiconductor package for enabling electrical conductivity, and a substrate comprising a depression which is electrically connected to the connecting terminal on the top surface of the substrate, wherein a spiral contact is formed in the depression in conic shape projecting upward from the bottom of the depression.

In accordance with the semiconductor module, because the semiconductor module comprises the semiconductor package located at the bottom of the semiconductor module, the connecting terminal which is provided on the bottom of the semiconductor package for enabling electrical conductivity, and the substrate comprising the depression which is electrically connected to the connecting terminal on the top surface of the substrate, wherein the spiral contact is formed in the depression in conic shape projecting upward from the bottom of the depression, the relay connector and the land terminal can be readily positioned and electrically bonded securely without heating, whereby the semiconductor module can be constructed.

In yet another aspect of the present invention, there is provided an electronic circuit module comprising the aforementioned semiconductor module mounted on a circuit board and electrically connected to the circuit board.

In accordance with the electronic circuit module, because the electronic circuit module comprises the semiconductor module mounted on the circuit board and electrically connected to the circuit board, the semiconductor module and the circuit board can be readily connected and electrically bonded securely without heating, whereby the electronic circuit module can be constructed.

In the aforementioned electronic circuit module, a dissipating fin may be attached via a metallic plate on at least one of the top surface and the side surface of the semiconductor module.

In accordance with the electronic circuit module, because the dissipating fin is attached via the metallic plate on at least one of the top surface and the side surface of the semiconductor module, the temperatures of the semiconductor module and the circuit board can be prevented from being increased and the semiconductor module and the circuit board can be electrically bonded securely, whereby the electronic circuit module can be constructed.

In the aforementioned electronic circuit module, a dissipating fan may be attached to the top surface of the semiconductor module.

In accordance with the electronic circuit module, because a dissipating fan is attached to the top surface of the semiconductor module, the temperatures of the semiconductor module and the circuit board can be prevented from being increased and the semiconductor module and the circuit board can be electrically bonded securely, whereby the electronic circuit module can be constructed.

In the aforementioned electronic circuit module, a dissipating peltiert element may be attached to the top surface of the semiconductor module.

In accordance with the electronic circuit module, because the dissipating peltiert element is attached to the top surface of the semiconductor module, the temperatures of the semiconductor module and the circuit board can be prevented from being increased and the semiconductor module and the circuit board can be electrically bonded securely, whereby the electronic circuit module can be constructed.

In still another aspect of the present invention, there is provided a circuit board with a socket comprising a socket board mounted on the circuit board, the socket board comprising a socket formed on the top surface of the socket board for enabling electrical conductivity and a connecting terminal formed on the bottom surface of the socket board for enabling electrical conductivity, wherein the socket has a depressed shape, a spiral contact is formed in the depression, and the connecting terminal is bonded to the circuit board and electrically connected to the circuit board.

In accordance with the circuit board with the socket, because the circuit board with the socket comprises the socket board mounted on the circuit board, the socket board comprising the socket formed on the top surface of the socket board for enabling electrical conductivity and the connecting terminal formed on the bottom surface of the socket board for enabling electrical conductivity, wherein the socket has the depressed shape, the spiral contact is formed in the depression, and the connecting terminal is bonded to the circuit board and electrically connected to the circuit board, a test board and the like can be readily measured and the semiconductor module and the circuit board can be electrically bonded securely without soldering and heating, whereby the electronic circuit module can be constructed.

In still yet another aspect of the present invention, there is provided a circuit board with a socket comprising a socket formed on the top surface of the circuit board for enabling electrical conductivity, wherein the socket has a depressed shape, and a spiral contact is formed in the depression.

In accordance with the circuit board with the socket, because the circuit board with the socket comprises the socket formed on the top surface of the circuit board for enabling electrical conductivity, wherein the socket has the depressed shape, and the spiral contact is formed in the depression, the semiconductor module and the circuit board can be electrically bonded securely without soldering and heating, whereby the electronic circuit module can be constructed.

In any one of the aforementioned circuit board with the socket, the spiral contact may be formed in conic shape projecting upward from the bottom of the depression.

In accordance with the aforementioned circuit board with the socket, because the spiral contact is formed in conic shape projecting upward from the bottom of the depression, the semiconductor module and the circuit board can be electrically bonded securely without soldering and heating, whereby an electronic circuit module can be constructed.

BRIEF DESCRIPTION OF THE DRAWINGS

FIG. 1A is a plain view of a semiconductor package according to an embodiment. FIG. 1B is a cross sectional view of the semiconductor package along A-A line in FIG. 1A, showing a conic spiral contact. FIG. 1C is a cross sectional view of the semiconductor package along A-A line in FIG. 1A, showing a horizontal spiral contact.

FIG. 2 is a cross sectional view of stacked semiconductor packages according to the embodiment.

FIG. 3 is a cross sectional view of semiconductor packages of which position is determined by an engaging depression and a protruding engaging portion.

FIG. 4 is a cross sectional view showing a semiconductor module constructed by three stacked semiconductor packages that are fixed by a plate holding member, (c-shaped holding member), and an electronic circuit module.

FIG. 5 is a cross sectional view of a semiconductor module constructed by three stacked semiconductor packages that are fixed by a plate holding member. FIG. 5A shows the semiconductor module before the plate holding member is put on. FIG. 5B shows the semiconductor module after the plate holding member is put on.

FIG. 6 is a cross sectional view of a semiconductor module constructed by three stacked semiconductor packages that are fixed by the plate holding member, and an electronic circuit module. FIG. 6A shows the semiconductor module before the plate holding member is put on. FIG. 6B shows the semiconductor module after the plate holding member is put on.

FIG. 7 is a view showing a plurality of semiconductor packages which are fixed by a pin holding member.

FIG. 8 is a cross sectional view of a semiconductor module.

FIG. 13 is an external view showing a part of the specific constructions of a semiconductor package, a semiconductor module, and an electronic circuit module.

FIG. 15 is a view showing a circuit board with sockets.

FIG. 16 is a view showing a circuit board with sockets.

DESCRIPTION OF THE PREFERRED EMBODIMENTS

Figure 2A:
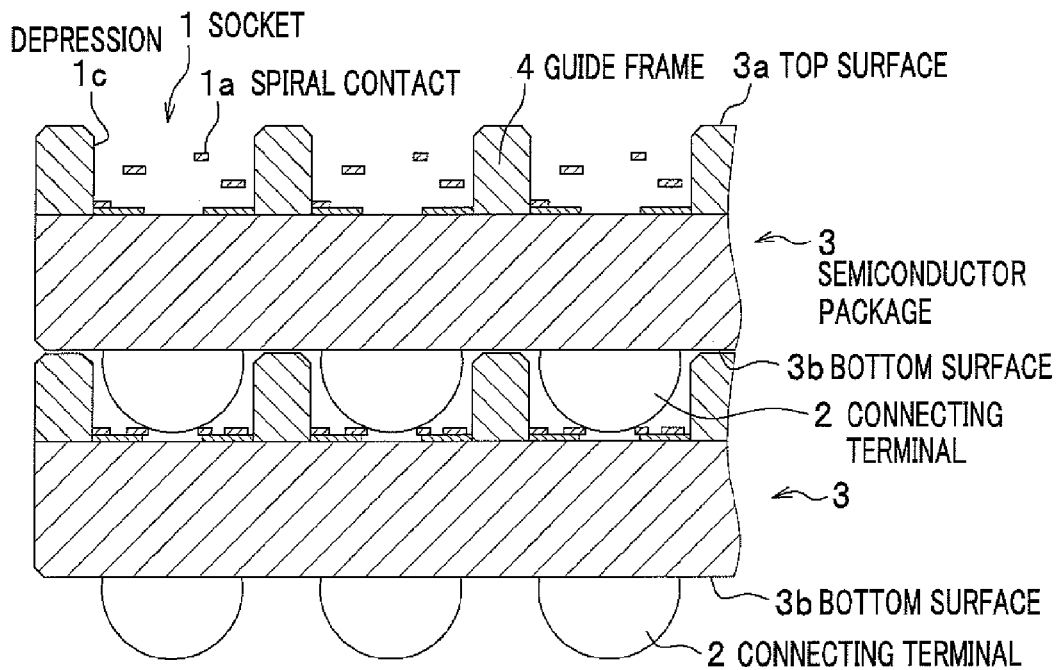
FIG. 2A shows the semiconductor package including the conic spiral contact.

A semiconductor package having a socket function, a semiconductor module, an electronic circuit module, and a circuit board with a socket according to the present invention are described with reference to the accompanying drawings.

FIG. 1A is a plain view of a semiconductor package according to an embodiment. FIG. 1B is a cross sectional view of the semiconductor package along A-A line in FIG. 1A, showing conic spiral contacts. FIG. 1C is a cross sectional view of the semiconductor package along A-A line in FIG. 1A, showing horizontal spiral contacts.

As shown in FIG. 1A, a plurality of sockets 1, 1' including spiral contacts 1a, 1a' is formed on the top surface 3a, 3a' of a semiconductor package 3, 3'.

As shown in FIG. 1B, the semiconductor package 3 includes the socket 1 formed on the top surface 3a for enabling electrical conductivity and a connecting terminal 2 formed on the bottom surface 3b for enabling electrical conductivity. The connecting terminal 2 is a solder ball.

It is to be noted that the connecting terminal 2 is not limited to be the solder ball and may be other connecting terminal as long as the connecting terminal is shaped to be projected and has electrical conductivity.

The socket 1 has a depressed shape, and the spiral contact 1a is formed in the depressions 1c. An insulating guide frame 4 is provided around the spiral contact 1a.

The spiral contact 1a is formed in conic shape projecting upward from the bottom of the depression 1c of the socket 1.

As shown in FIG. 1C, a semiconductor package 3' includes a socket 1' formed on the top surface 3a' for enabling electrical conductivity and a connecting terminals 2' formed on the bottom surface 3b' for enabling electrical conductivity.

The socket 1' has a depressed shape, and a spiral contact 1a' is formed in the depression 1c'. An insulating guide frame 4' is provided around the spiral contact 1a'.

The spiral contact 1a is formed horizontally on the opening of the depression 1c' of the socket 1'.

The semiconductor package 3, 3' incorporates a semiconductor chip not shown. The connecting terminals 2, 2' can be detachably connected to the socket 1, 1a', and the position of the connecting terminal 2, 2' and the socket 1, 1a' can be readily determined.

The spiral contact 1a, 1a' is formed of a copper member which is nickel plated and then gold plated; however, the spiral contact 1a, 1a' may be formed of other conductors. The guide frame 4, 4' is made of polyimid resin; however, the guide frame 4, 4' may be made of other insulators.

Figure 2B:
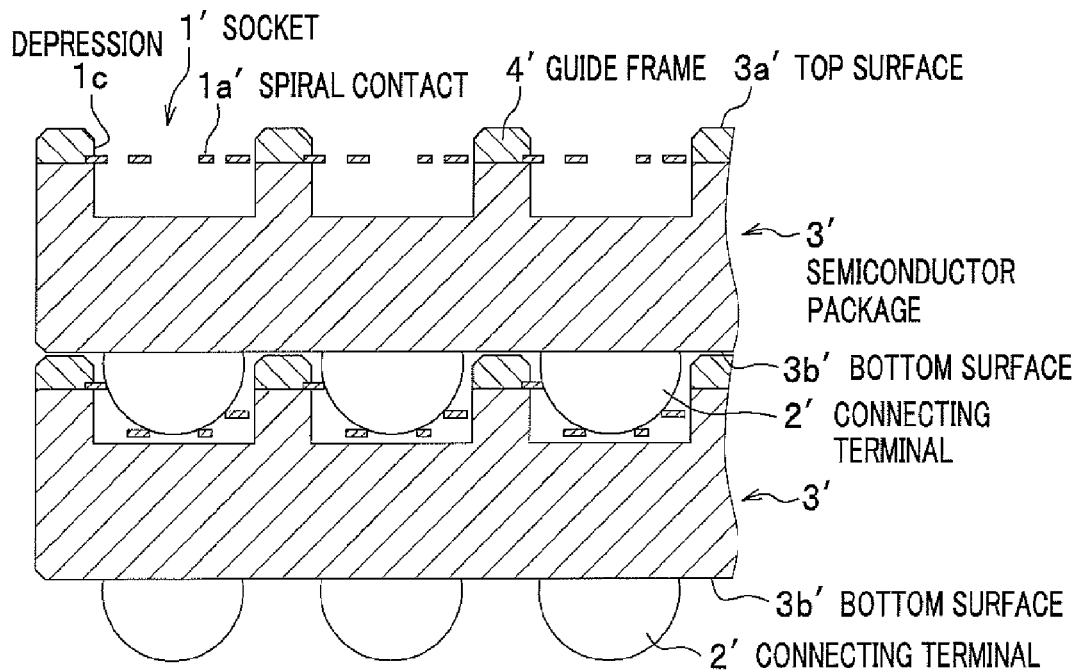
FIG. 2B shows the semiconductor package including the horizontal spiral contact.

FIG. 2 is a cross sectional view of stacked semiconductor packages according to the embodiment. FIG. 2A shows the semiconductor package including the conic spiral contact. FIG. 2B shows the semiconductor package including the horizontal spiral contact.

As shown in FIG. 2A, the semiconductor packages 3, 3 are stacked one above the other. The connecting terminal 2 of the semiconductor package 3 which is located upper side is inserted into the socket 1 of the semiconductor package 3 which is located lower side while keeping electrical conductivity. The connecting terminal 2 is guided by the guide frame 4 and presses the conic spiral contact 1a. The spiral contact 1a scrubs the connecting terminal 2 (referred to as a solder ball hereinafter) at a place where the spiral contact 1a is in contact with the solder ball.

As shown in FIG. 2B, the semiconductor packages 3', 3' are stacked one above the other. The connecting terminal 2' of the semiconductor package 3' which is located upper side is inserted into the socket 1' of the semiconductor package 3' which is located lower side while keeping electrical conductivity. The connecting terminal 2' is guided by the guide frame 4' and presses the horizontal spiral contact 1a'. The spiral contact 1a' scrubs the solder ball 2' as if the spiral contact 1a' curves a surface of the solder ball 2' at a place where the spiral contact 1a' is in contact with the solder ball 2'.

In FIGS. 2A and 2B, the spiral contact curves and scrubs oxidized film formed on a surface of the ball-shaped connecting terminal, thereby the spiral contact can be electrically connected to the connecting terminal well.

Figure 3A:
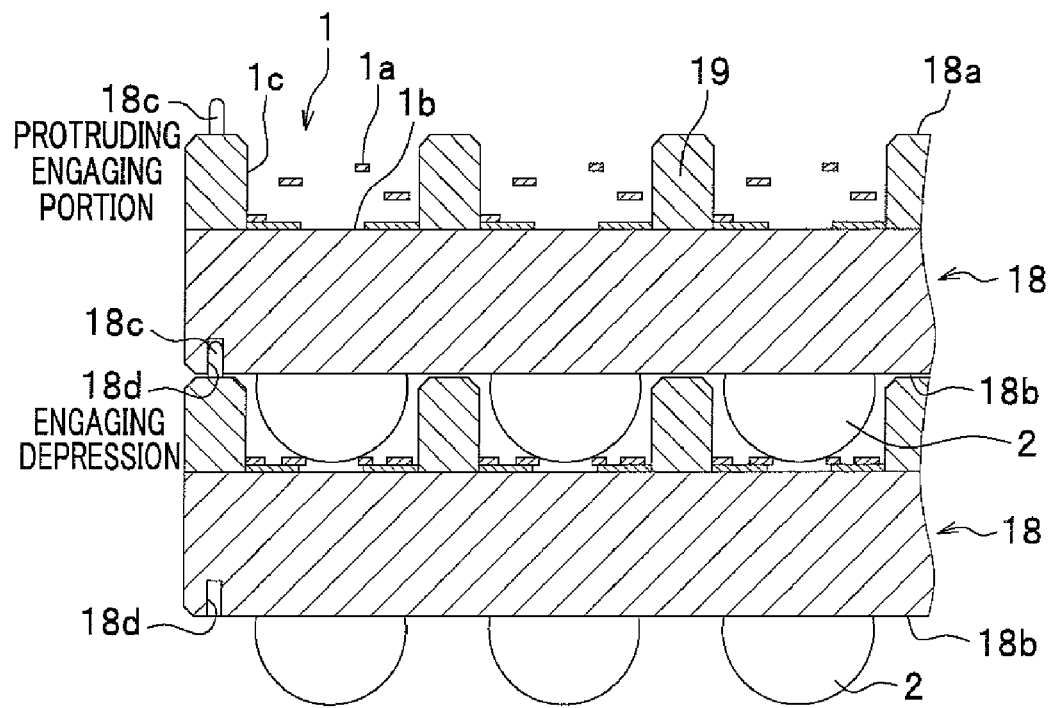
FIG. 3A shows a semiconductor package which includes the protruding engaging portion on the top surface of the semiconductor package and a semiconductor package which includes the engaging depression on the bottom surface of the semiconductor package.
Figure 3B:
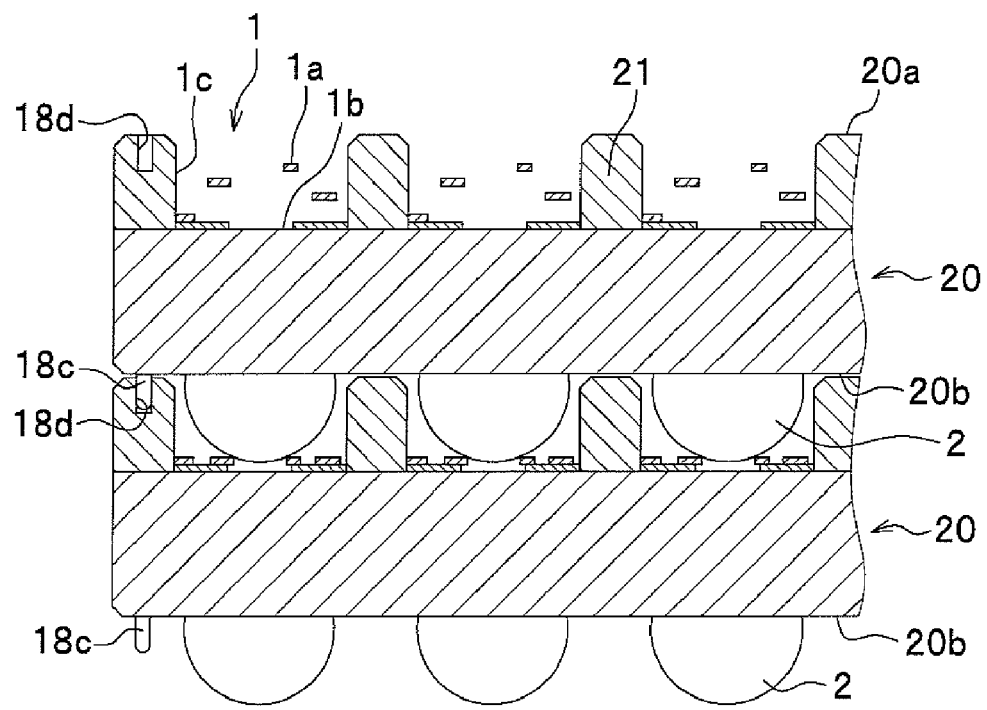
FIG. 3B shows a semiconductor package which includes the engaging depression on the top surface of the semiconductor package and a semiconductor package which includes the engaging depression on the bottom surface of the semiconductor package.

FIG. 3 is a cross sectional view of semiconductor packages of which position is determined by an engaging depression and a protruding engaging portion. FIG. 3A shows a semiconductor package which includes the protruding engaging portion on the top surface of the semiconductor package and a semiconductor package which includes the engaging depression on the bottom surface of the semiconductor package. FIG. 3B shows a semiconductor package which includes the engaging depression on the top surface of the semiconductor package and a semiconductor package which includes the engaging depression on the bottom surface of the semiconductor package.

As shown in FIG. 3A, when semiconductor packages 18, 18 are stacked one above the other, the horizontal position of the connecting terminal 2 is determined by a guide frame 19, however, the horizontal position of the connecting terminal 2 may be determined by a depression and a protruding portion provided on the top surface 18a and the bottom surface 18b of the semiconductor packages 18, 18.

More specifically, protruding engaging portions 18c are formed in proximity of both ends of the top surface 18a of the semiconductor package 18, and engaging depressions 18d are formed in proximity of both ends of the bottom surface 18b which corresponds to the proximity of the ends of the top surface 18a. Two protruding engaging portions 18c are formed on the top surface 18a of the semiconductor package 18 and two engaging depressions 18d are formed on the bottom surface of the semiconductor package 18 in this embodiment. However, at least one protruding engaging portion 18c may be formed on the top surface 18a and at least one engaging depression 18d may be formed on the bottom surface 18b. The engaging depressions 18d of the semiconductor package 18 which is located upper side are fit into the protruding engaging portions 18c of the semiconductor 18 which is located lower side. The shape of the protruding engaging portions are protruding in this embodiment, however, the shape of the protruding engaging portion may be trigonal pyramid, polygonal cone, and polygonal cylinder and other shapes so long as the engaging depression is able to receive the protruding engaging portion. The protruding engaging portion and the engaging depression may be formed vice-versa.

FIG. 3B shows a case where the engaging depression 18d is formed on the top surface 20a of a semiconductor package 20 and the protruding engaging portion 18c is formed on the bottom surface 20b of the semiconductor package 20.

That is, at least one engaging depression 18d is formed on the top surface 20a of the semiconductor package 20 and at least one protruding engaging portion 18c are formed on the bottom surface 20b of the semiconductor package 20. Then, the protruding engaging portion 18c of the semiconductor package which is located upper side is fit into the engaging depression 18d of the semiconductor 20 which is located lower side.

The engaging depression and protruding engaging portion may be formed at an end and a center as long as the engaging depression and protruding engaging portion are formed on the top surface or the bottom surface. Both of the engaging depression and protruding engaging portion may be formed on the same surface at the same time.

Figure 4A:
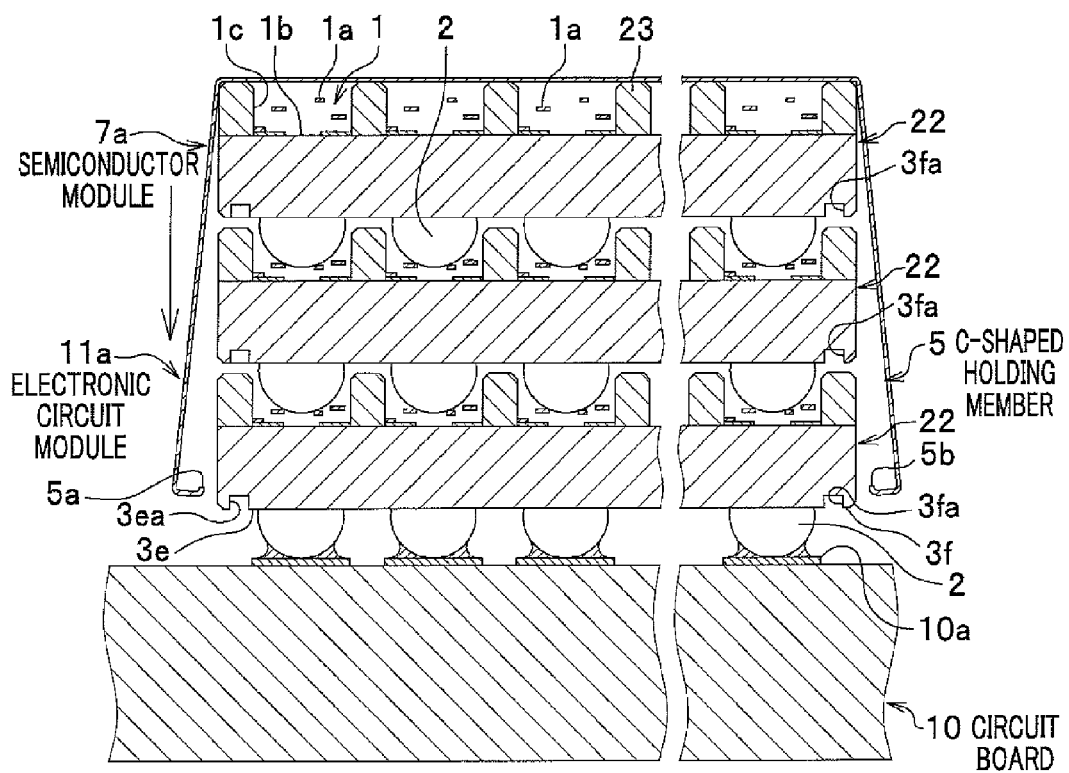
FIG. 4A shows the semiconductor module before the plate holding member is fixed.
Figure 4B:
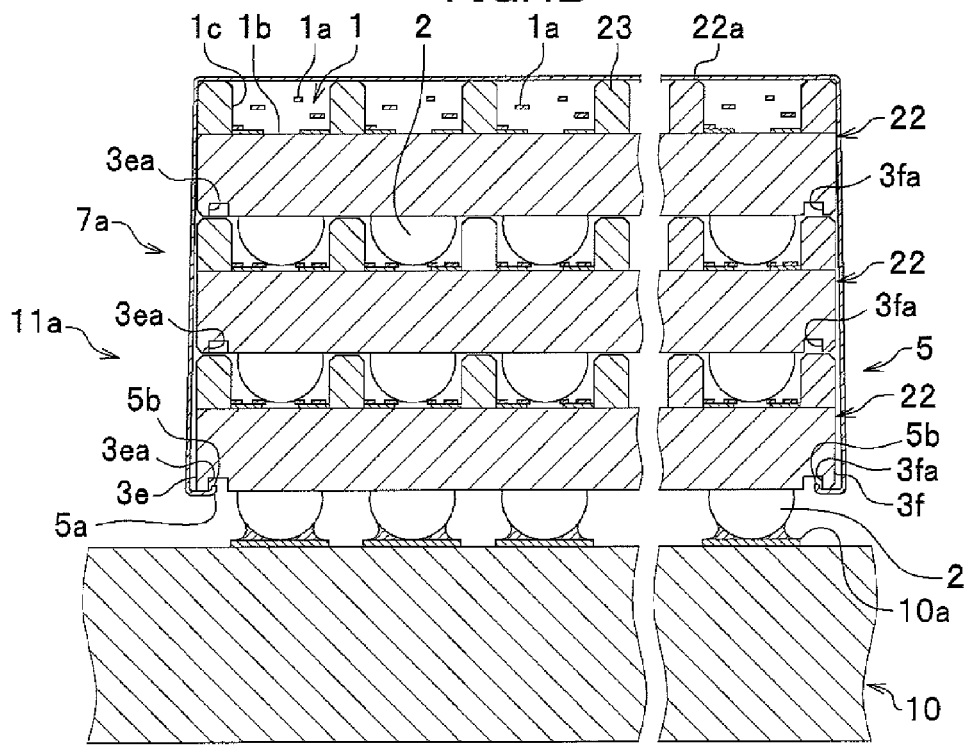
FIG. 4B shows the semiconductor module after the plate holding member is fixed.

FIG. 4 is a cross sectional view showing a semiconductor module constructed by three semiconductor packages stacked one on top of the other and held by a plate holding member, and an electronic circuit module. FIG. 4A shows the semiconductor module before the plate holding member is fixed. FIG. 4B shows the semiconductor module after the plate holding member is fixed.

As shown in FIG. 4A, a semiconductor module 7a is constructed by stacking a plurality of semiconductor packages 22 wherein each of the plurality of semiconductor packages 22 is electrically connected to each other.

Depressions 3ea, 3fa which engage a plate holding member 5 that holds the semiconductor packages 22 are formed in groove shape on the bottom surfaces 3e, 3f of the semiconductor package 22.

The connecting terminal 2 of the semiconductor package 22 is electrically connected to a land terminal 10a of a circuit board 10 by reflow soldering. Two semiconductor packages 22, 22 are further stacked to the semiconductor package 22. At this time, the connecting terminals 2 of the semiconductor packages 22 are raised by spring-like force of the spiral contacts 1a. Therefore, a c-shaped plate holding member 5 (c-shaped holding member) is put on the three stacked semiconductor packages 22, 22, 22 from the top to the bottom as shown by an arrow.

The holding member is not limited to a plate holding member and may be a c-shaped line holding member, which has the same effect as the plate holding member.

As shown in FIG. 4B, the depressions 3ea, 3fa engage ends 5a, 5b of the plate holding member 5 having claw hooks to hold the three stacked semiconductor packages 22, 22, 22 with the plate holding member 5. Thus, the semiconductor module 7a is fixed to the circuit board 10, whereby an electronic circuit module 11a is constructed.

FIG. 5 is a cross sectional view of a semiconductor module constructed by three stacked semiconductor packages that are fixed by a plate holding member. FIG. 5A shows the semiconductor module before the plate holding member is put on. FIG. 5B shows the semiconductor module after the plate holding member is put on.

As shown in FIG. 5A, the semiconductor package 3 does not include an engaging groove and the like which engages a plate holding member 12 that holds semiconductor packages 3.

The plate holding member 12 consists of an upper lid 12a and a base 12b. The base 12b includes a pin engaging portion 12bb at an end of the base 12b. The engaging portion 12b is inserted into a through hole 6f of a relay board 6 and then fixed by soldering.

Two side surfaces which are opposed to each other are supported in this embodiment; however, a pair of side surfaces that is orthogonal to the two side surfaces may also be supported.

A socket 6h which relays electrical connection is provided on the top surface 6d of the relay board 6. The depression 6c is formed in the socket 6h, and a spiral contact 6a is formed in conic shape projecting upward from the bottom 6b of the depression 6c.

The connecting terminal 2 of the semiconductor package 3 located at the bottom which constitutes the semiconductor module 7b is bonded to the spiral contact 6a. Thus, the horizontal positions of the semiconductor packages 3, 3, 3 are determined and the semiconductor packages 3, 3, 3 are also electrically connected to each other.

Then, the upper lid 12a of the plate holding member 12 is put on the semiconductor packages from the top.

As shown in FIG. 5B, a claw 12aa of the upper lid 12a then engages a claw 12ba of the base 12b to hold the stacked semiconductor packages 3, 3, 3 by the plate holding member 12. Thus, the semiconductor module 7b which is fixed to the relay board 6 is constructed.

The stacked semiconductor packages 3, 3, 3 are thus electrically connected and securely fixed to the relay board 6 by the plate holding member 12.

An electronic circuit module is constructed by mounting the semiconductor module 7b on a circuit board.

Figure 6A:
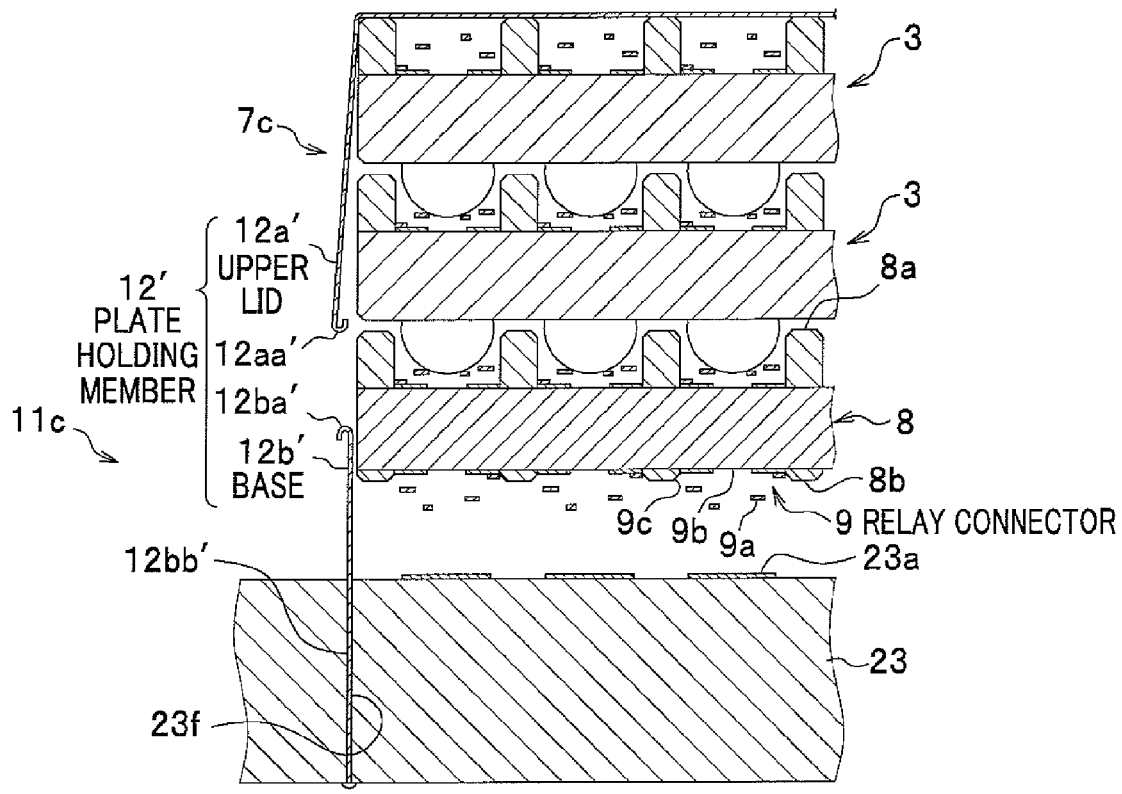
Figure 6B:
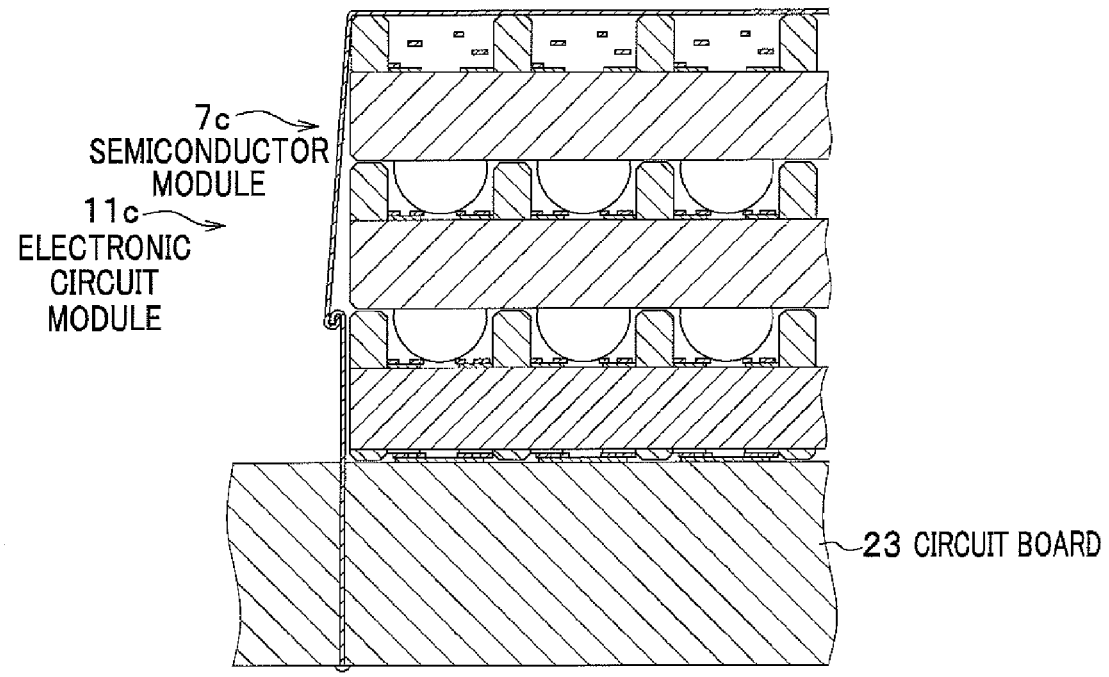

FIG. 6 is a cross sectional view of a semiconductor module constructed by three stacked semiconductor packages that are fixed by a plate holding member and an electronic circuit module. FIG. 6A shows the semiconductor module before the plate holding member is put on. FIG. 6B shows the semiconductor module after the plate holding member is put on.

As shown in FIG. 6A, a plate holding member 12' consists of an upper lid 12a' and a base 12b'. The base 12b' includes a pin engaging portion 12bb' at an end of the base 12b'. The engaging portion 12bb' is inserted into a through hole 23f of an circuit board 23 and then fixed by soldering.

An engaging portion 12ba' is provided at the other end of the base 12b'. Engaging portions (claw□12aa' are provided at both ends of the upper lid 12a. The engaging portion 12aa' and the engaging portion 12ba' (claw) of the base 12b' are both formed to be hook-shape. Thus, the engaging portion 12aa' and the engaging portion 12ba' are securely fixed.

A land terminal 23a is provided on the top surface of the circuit board 23. A relay connector 9A and a socket depression 9c are provided on the bottom surface 8b of a semiconductor package 8 located at the bottom which constitutes a semiconductor module 7c, and the spiral contact 9a is formed in the depression 9c in conic shape projecting upward from the bottom 9b of the depression 9c.

The spiral contact 9a presses the land terminals 23a and is electrically bonded to the land terminals 23a. The semiconductor packages 8, 3, 3 are positioned horizontally in front and rear direction as well as left and right direction.

As shown in FIG. 6B, the stacked semiconductor packages 8, 3, 3 are electrically connected and securely fixed to the circuit board 23 by the plate holding member 12'. Thus, the electronic circuit module 11c is constructed.

A land terminal refers to the land terminal provided on the relay board and the circuit board, and the terminal (land). A substrate refers to the relay board and the circuit board.

Figure 7A:
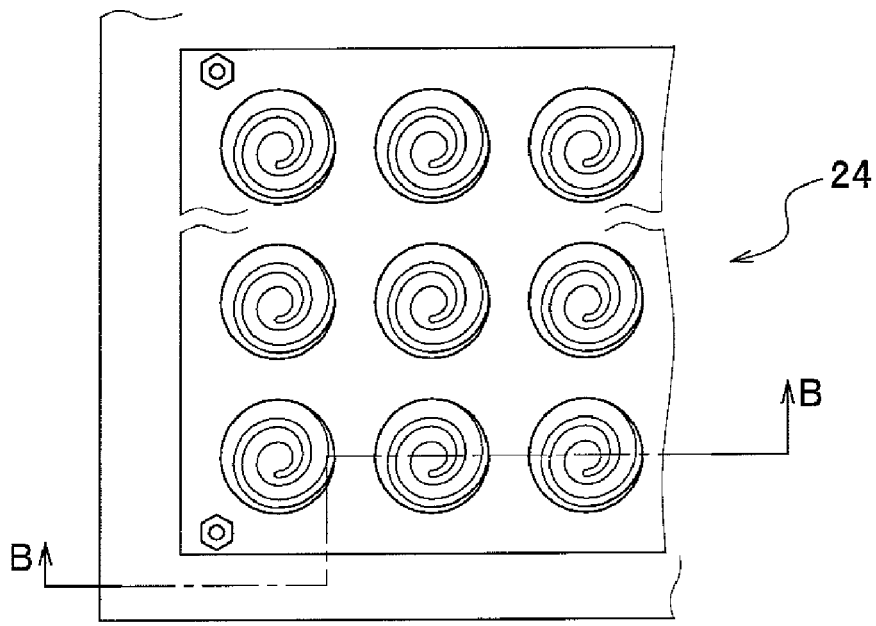
FIG. 7A is a plain view.
Figure 7B:
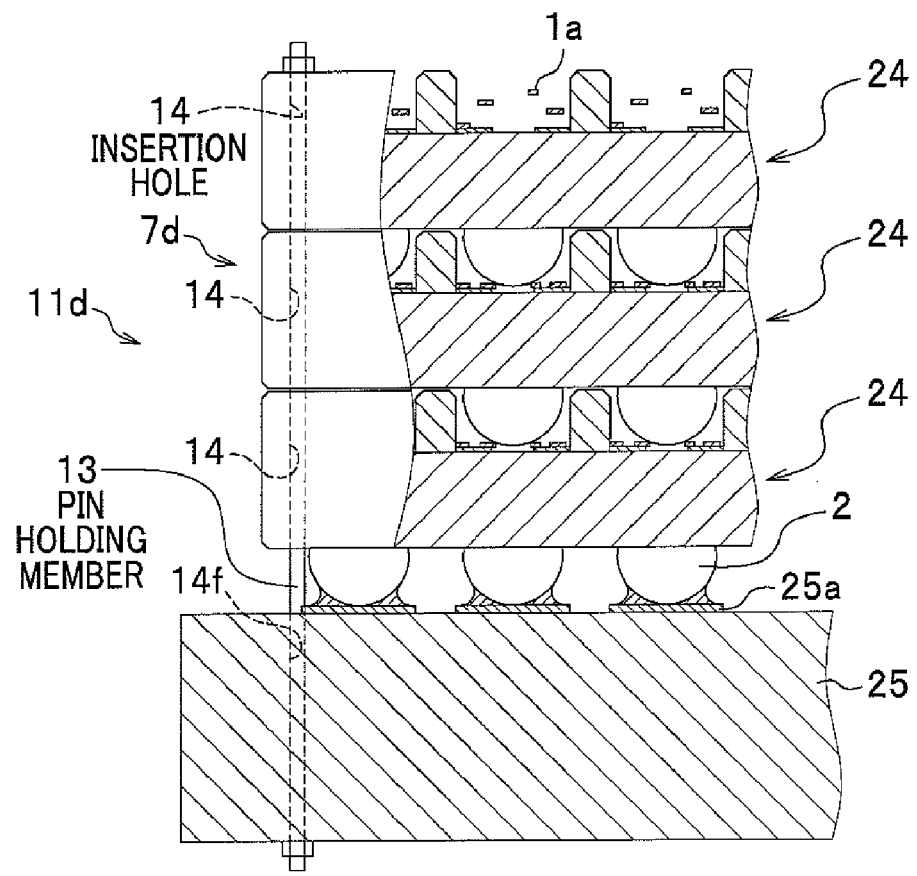
FIG. 7B is a cross sectional view along line B-B in FIG. 7A.

FIG. 7 is a view showing a plurality of semiconductor packages which are fixed by a pin holding member. FIG. 7A is a plain view. FIG. 7B is a cross sectional view along line B-B in FIG. 7A.

As shown in FIGS. 7A and 7B, four insertion holes 14 through which pin holding members 13 for holding a plurality of semiconductor packages 24, 24 . . . are inserted are bored at the proximity of corners of the semiconductor package 24 in a vertical direction of the semiconductor package 24.

As shown in FIG. 7B, the connecting terminal 2 of the semiconductor package 24 is electrically connected to a land 25a of a circuit board 25 by reflow soldering. Two more semiconductor packages 24, 24 are further stacked on the semiconductor package 24. At this time, the connecting terminal 2 of the semiconductor package 24 is raised by spring-like force of the spiral contact 1a. Thus, the pin holding members 13 are inserted into the insertion holes 14□14□14 of the semiconductor package 24 and through holes 14f, pressing the three stacked semiconductor packages 24, 24, 24. Thus, the pin holding members 13 hold the three stacked semiconductor packages 24, 24, 24 to the circuit board 25.

Thus, a semiconductor module 7d is fixed to the circuit board 25, whereby an electronic circuit module 11d is constructed.

Figure 8A:
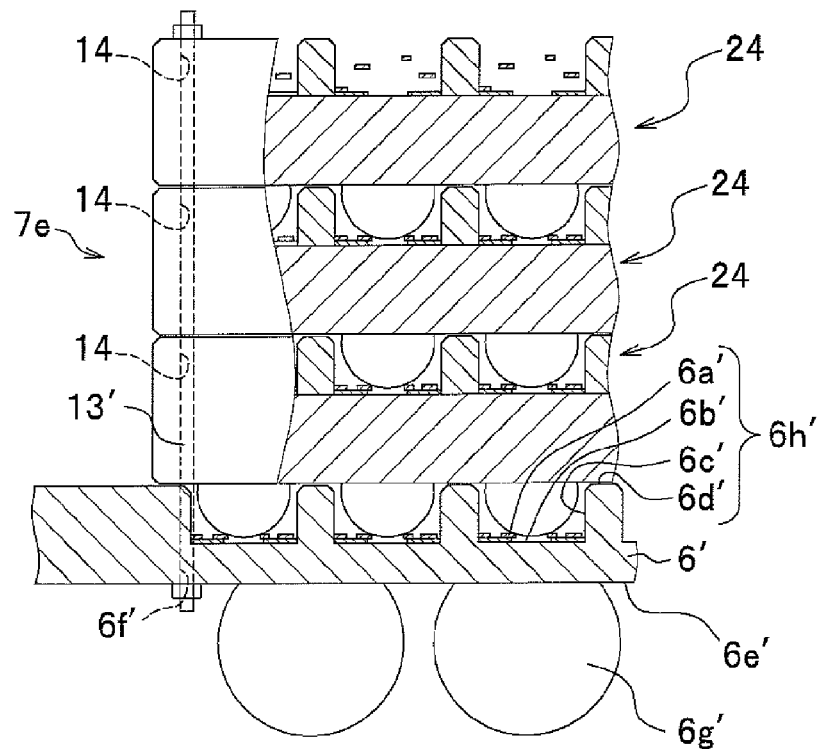
FIG. 8A is a cross sectional view of a semiconductor module including a relay board with sockets.
Figure 8B:
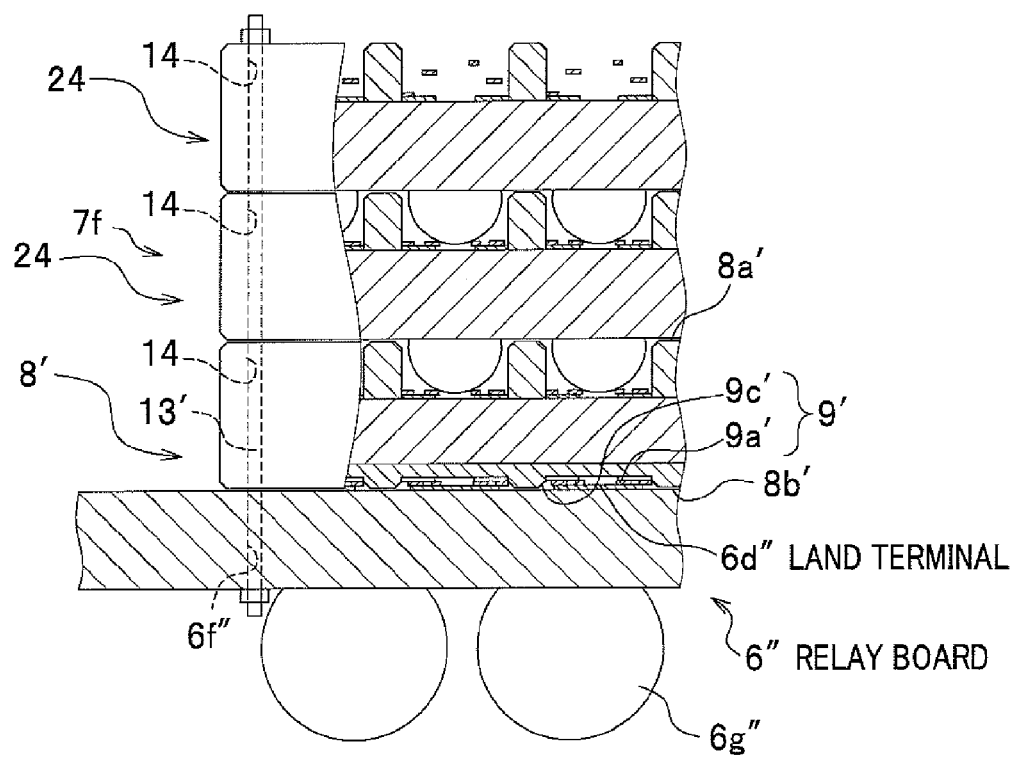
FIG. 8B is a cross sectional view of a semiconductor module including a semiconductor package and a relay board with a land terminal.

FIG. 8 is a cross sectional view of a semiconductor module. FIG. 8A is a cross sectional view of a semiconductor module including a relay board with sockets. FIG. 8B is a cross sectional view of a semiconductor module including a semiconductor package and a relay board with a land terminal.

As shown in FIG. 8A, the four insertion holes 14 through which pin holding members 13' for holding the plurality of semiconductor packages 24, 24 . . . are inserted are bored at the proximity of corners of the semiconductor package 24 in the vertical direction of the semiconductor package 24. The pin holding members 13' are inserted into the insertion holes 14☐14☐14 of the semiconductor packages 24 and through holes 6f to fix the three stacked semiconductor packages 24, 24, 24 to a relay board 6', whereby a semiconductor module 7e is constructed.

As shown in FIG. 8B, a semiconductor package 8' is provided at the bottom of a semiconductor module 7f. The semiconductor package 8' include a relay connector 9' on which a socket depression 9c' is provided at the bottom surface 8b'. Thus, a relay board 6" including a land terminal 6d which is allowed to be bonded with the relay connector 9'.

In the semiconductor module 7f, the four insertion holes 14 through which the pin holding members 13' for holding a plurality of semiconductor packages 24, 24, . . . , 8' are inserted are bored at the proximity of corners of the semiconductor package 24 in the vertical direction of the semiconductor package 24. The pin holding members 13' are inserted into the insertion holes 14☐14☐14 of the semiconductor packages 24 and through holes 6f" to fix the three stacked semiconductor packages 24, 8' to a relay board 6".

Figure 9:
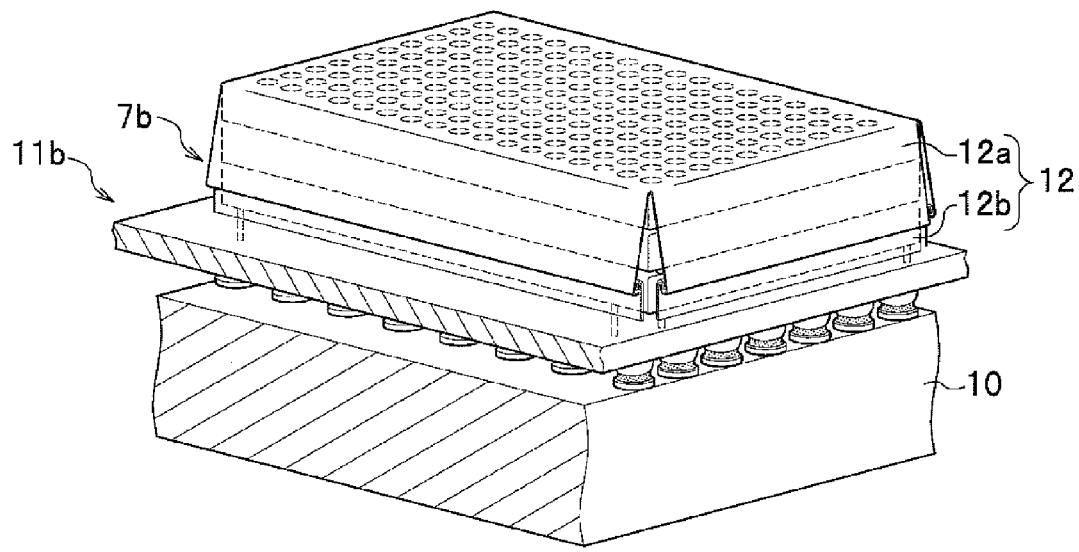
FIG. 9 is a perspective view showing an electronic circuit module.
Figure 10:
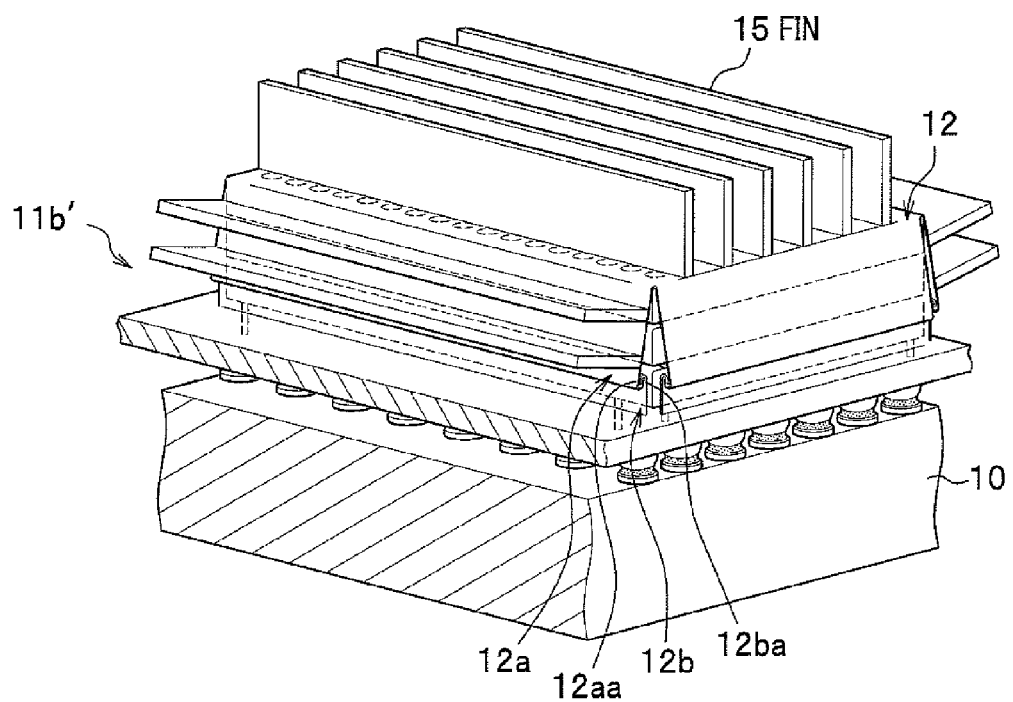
FIG. 10 is a perspective view showing an electronic circuit module.

FIG. 9 and FIG. 10 are perspective views showing electronic circuit modules. As shown in FIG. 9, the upper lid 12a of the plate holding member 12 for an electronic circuit module 11b is formed of metal and effective for preventing the temperature of the semiconductor module 7b from being increased. As shown in FIG. 10, dissipating fins 15 are attached on the top surface of the upper lid 12a to further improve the cooling performance (electronic circuit module 11b').

Figure 11:
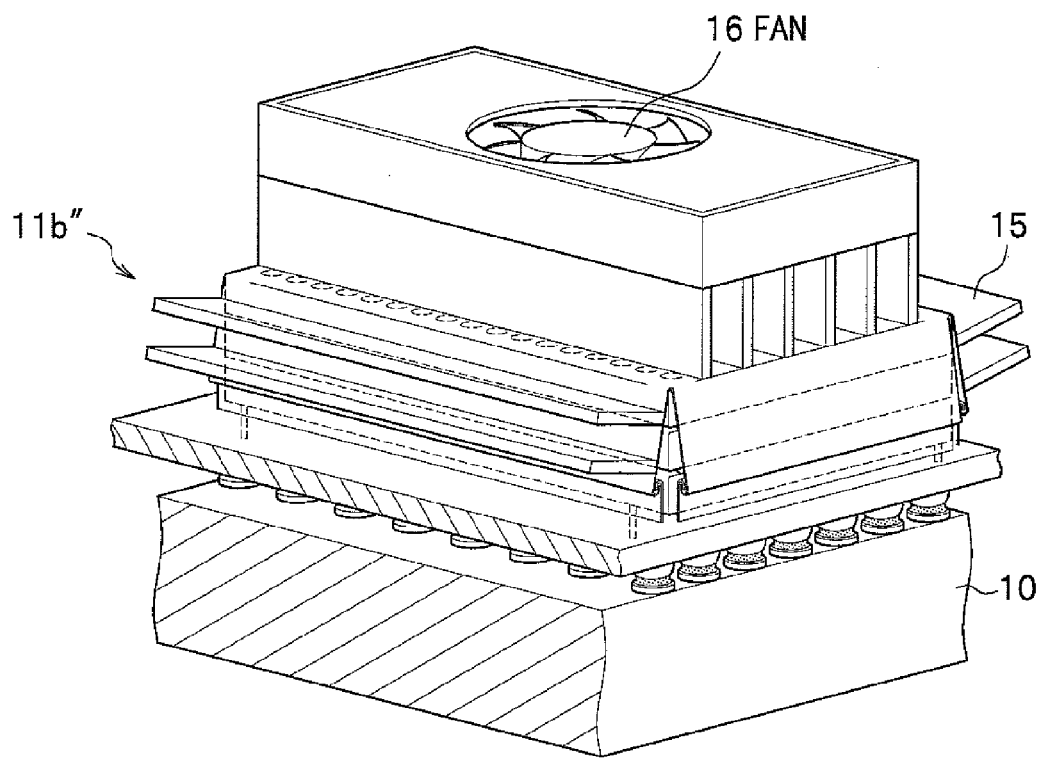
FIG. 11 is a perspective view showing an electronic circuit module.

FIG. 11 is a perspective view showing an electronic circuit module to further improve the cooling performance. As shown in FIG. 11, a dissipating fan 16 is installed on the top surfaces of the fins 15 (electronic circuit module 11b").

Figure 12:
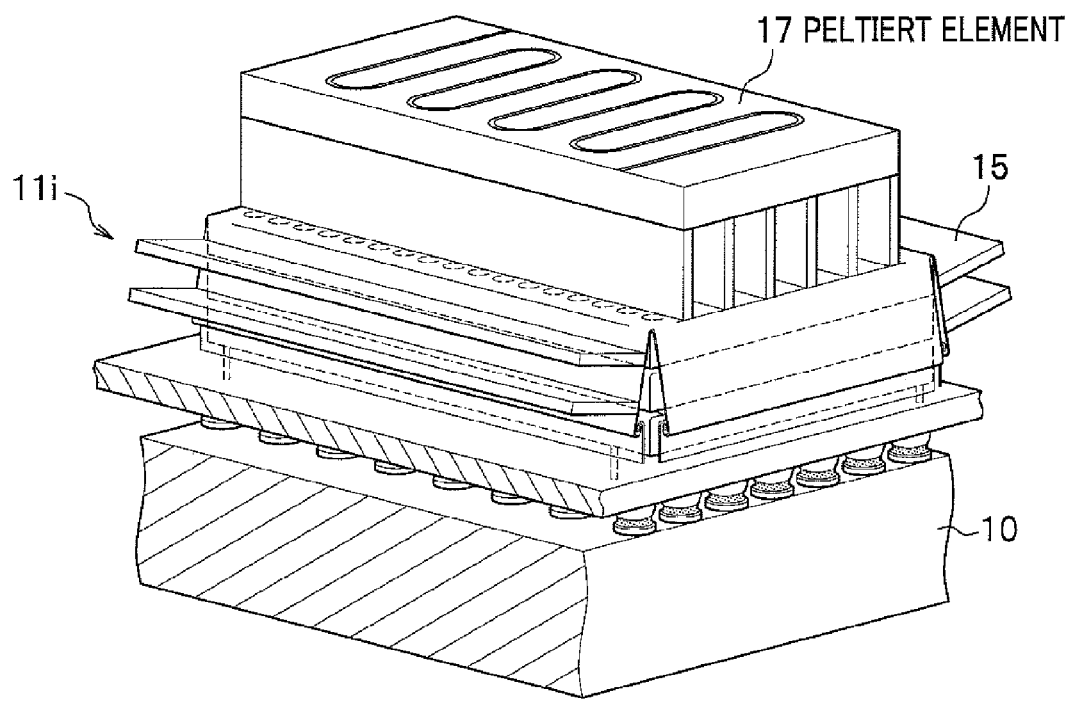
FIG. 12 is a perspective view showing an electronic circuit module.

FIG. 12 is a perspective view showing an electronic circuit module on which a peltiert element is attached to further improve the cooling performance. As shown in FIG. 12, a peltiert element 17 is attached on the top surface of the fins 15☐electronic circuit module 11i☐.

FIGS. 13 and 14 are external views showing a part of the specific constructions of a semiconductor package, a semiconductor module, and an electronic circuit module.

As shown in FIGS. 13 and 14, a semiconductor module is constructed by stacking semiconductor packages and/or mounting semiconductor packages on a relay board. An electronic circuit module having a socket function is then constructed by connecting the semiconductor module to a circuit board.

FIGS. 13A and 13B show semiconductor packages.

As shown in FIG. 13A, the semiconductor package 3 includes the socket 1 formed on the top surface 3a for enabling electrical conductivity and the connecting terminal 2 formed on the bottom surface for enabling electrical conductivity.

As shown in FIG. 13B, a relay connector and a socket depression are provided on the bottom of the semiconductor package 8, 8' located at the bottom of the semiconductor module, wherein the spiral contact 9a is formed in conic shape projecting upward from the bottom of the socket depression.

FIGS. 13C and 13D show semiconductor modules.

As shown in FIG. 13C, a plurality of semiconductor packages 3 is mounted on the top surface of a module board (relay board) in a semiconductor module 7g. The semiconductor modules 7g are mounted on a circuit board not shown.

A semiconductor module 7h is constructed as shown in FIG. 13D.

Figure 14A:
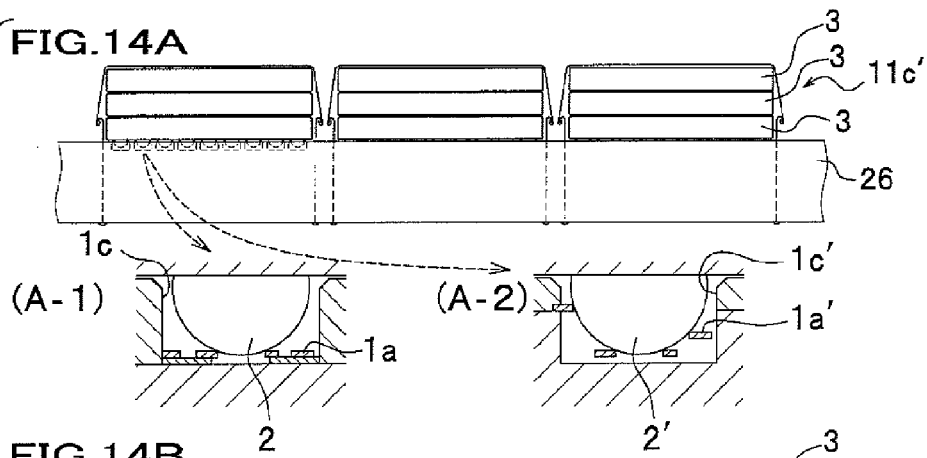
FIG. 14 is an external view showing a part of the specific constructions of an electronic circuit module.

FIGS. 13E, F, FIGS. 14A, B, C and D show electronic circuit modules.

As shown in FIG. 13E, an electronic circuit module 11g' is constructed by mounting a semiconductor module including the semiconductor packages 8 on a circuit board 10.

As shown in FIG. 13F, an electronic circuit module 11k' is constructed by mounting the semiconductor modules shown in FIG. 13D in three rows.

As shown in FIG. 14A, an electronic circuit module 11c' is constructed by a circuit board 26 including depressions having a socket function on the top surface of the circuit board 26.

FIGS. 14(A-1) and 14(A-2) are enlarged cross sectional views of the depression 1c and the depression 1c'. The enlarged cross sectional views of the depression 1c and the depression 1c' schematically show the connection between the connecting terminal 2, 2' and spiral contact 1a, 1a' shown in FIGS. 2A and 2B.

Figure 14B:
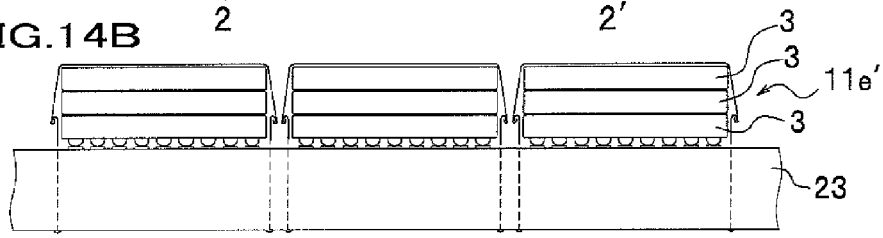

As shown in FIG. 14B, a plurality of semiconductor modules is mounted horizontally in an electronic circuit module 11e'.

Figure 14C:
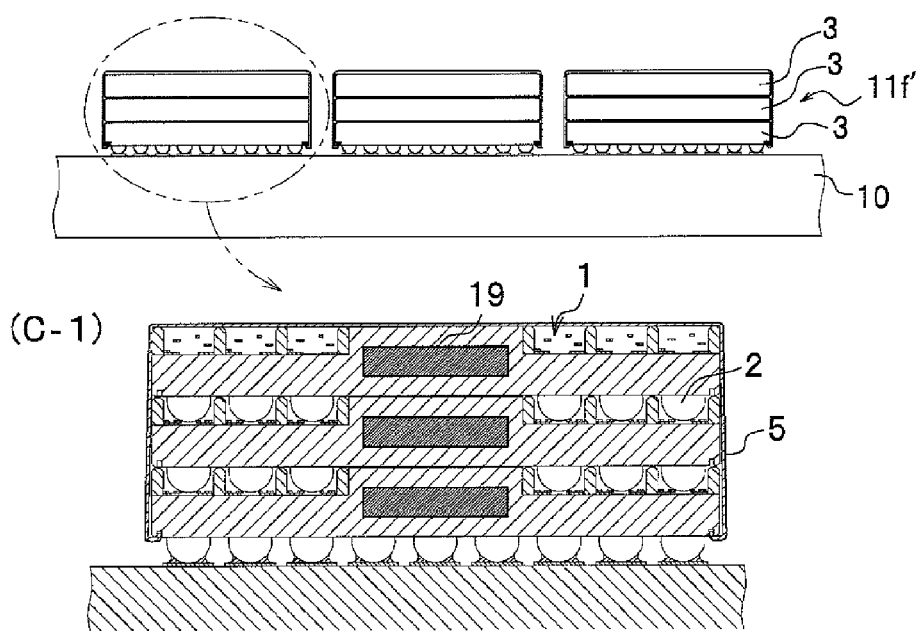

As shown in FIG. 14C, a plurality of semiconductor modules is mounted horizontally in an electronic circuit module 11f'. FIG. 14(C-1) shows an enlarged cross sectional view of a part of an electronic circuit module 11f'. The enlarged cross sectional view is a view which enlarges a part of FIG. 14C and cross sectioned to clarify the description. The enlarged cross sectional view shows arrangement of semiconductor chips 19. A plurality of sockets 1, 1, . . . , 1 is formed around the semiconductor chips 19. The socket 1 is formed where the socket 1 is not in contact with the semiconductor chip 19. The number of the sockets 1 to be formed may be arbitrarily determined.

A semiconductor package generally incorporates a semiconductor chip; however, sometimes a semiconductor package including only a connecting terminal and a socket without semiconductor chip is used for electrical conductivity. Thus, the semiconductor package may not necessarily incorporate a semiconductor chip.

Figure 14D:
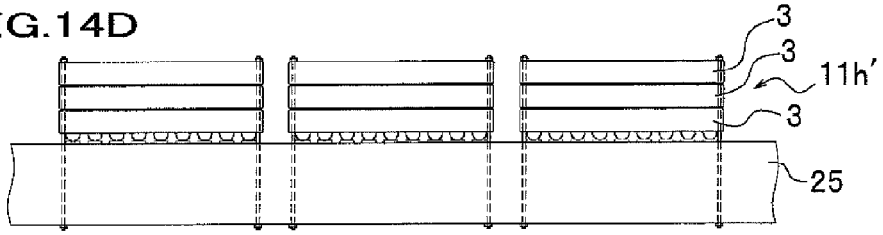

As shown in FIG. 14D, a plurality of semiconductor modules is mounted horizontally in an electronic circuit module 11h'.

Figure 15A:
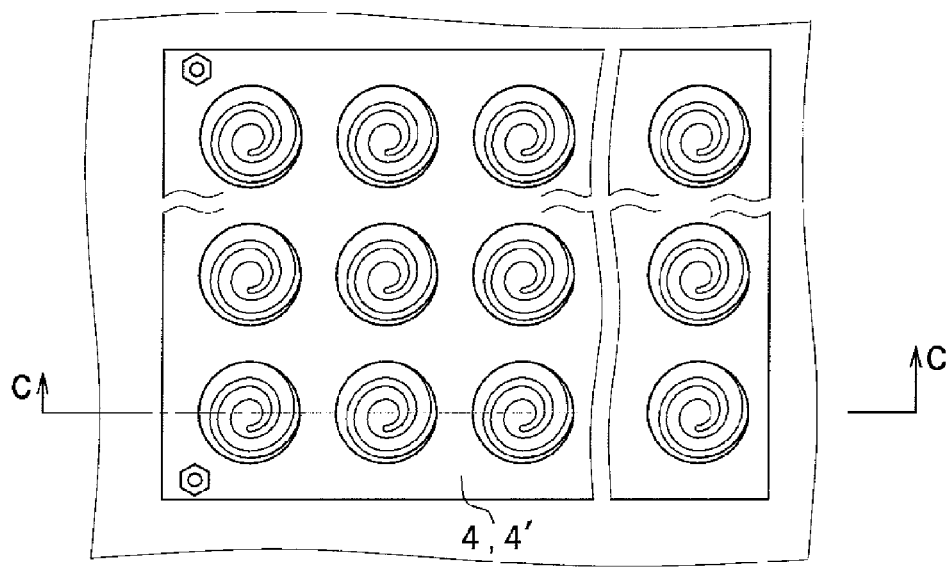
FIG. 15A is a plain view.
Figure 15B:
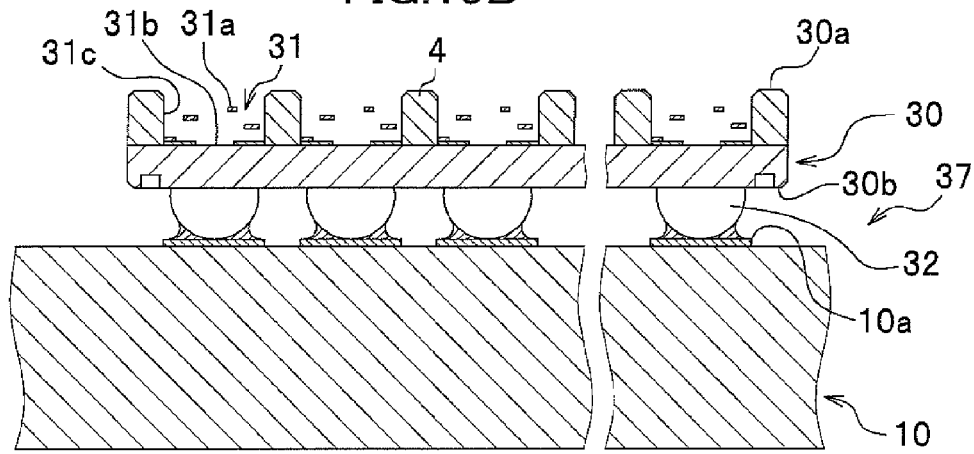
FIGS. 15B and 15C are cross sectional views along C-C line shown in FIG. 15A.
Figure 15C:
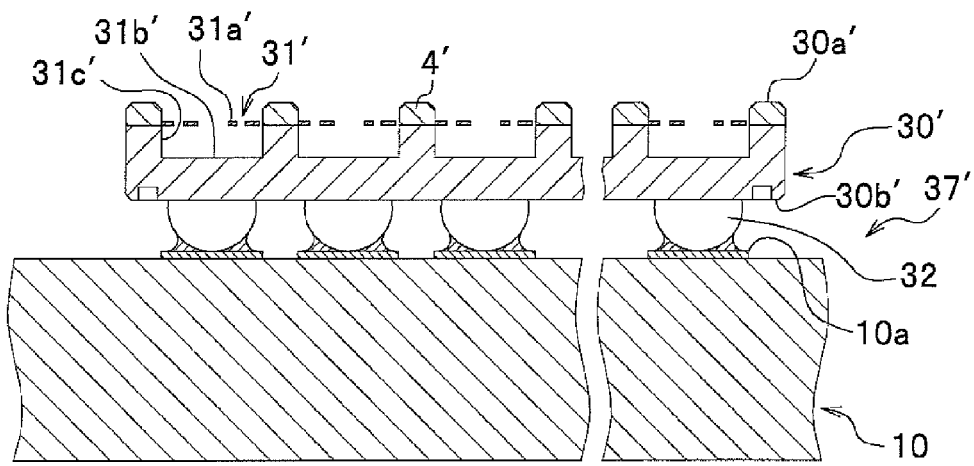

FIG. 15 is a view showing a circuit board with sockets. FIG. 15A is a plain view. FIGS. 15B and 15C are cross sectional views along C-C line shown in FIG. 15A. FIG. 15B shows a circuit board with sockets including conic spiral contacts. FIG. 15C shows a circuit board with sockets including horizontal spiral contacts.

As shown in FIGS. 15A and 15B, a circuit board with sockets 37 includes a socket 31 which enables electrical conductivity on the top surface 30a and a connecting terminal 32 which enables electrical conductivity on the bottom surface 30b. The socket 31 has a depressed shape and a spiral contact 31a is formed in the depression in conic shape projecting upward from the bottom of the depression. The connecting terminal 32 is connected to a land 10a of the circuit board 10, whereby the circuit board with sockets 37 is constructed.

The spiral contact 31a is formed in conic shape projecting upward from the bottom 31b of the depression 31c of the socket 31. The guide frame 4 is attached to the bottom of the spiral contact 31a and guides the connecting terminal 2 of the semiconductor package 3 shown in FIG. 2.

As shown in FIG. 15C, a spiral contact 31a' is formed horizontally at an opening of a depression (blind via hole)

31c' in a socket 31'. A guide frame 4' is attached to upside of the opening of the depression 31c'. With this configuration, the guide frame 4' guides the connecting terminal 2' of the semiconductor package 3' shown in FIG. 2.

Figure 16A:
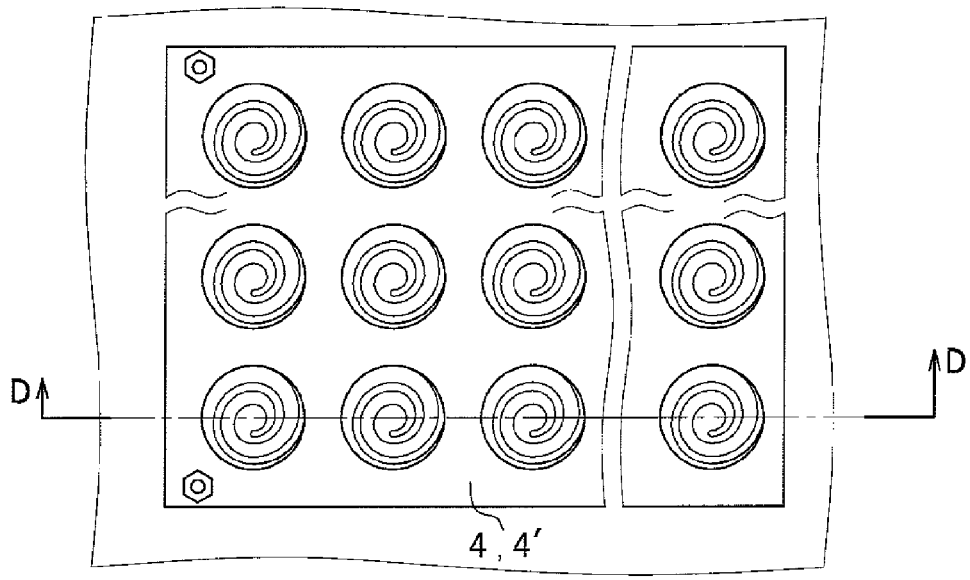
FIG. 16A is a plain view.
Figure 16B:
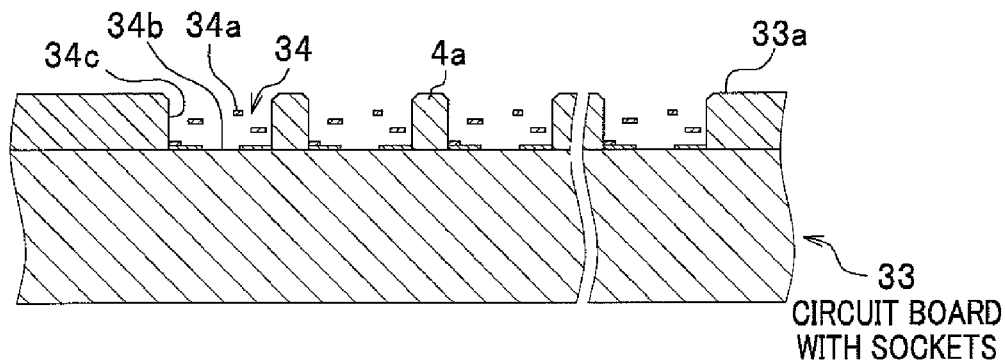
FIGS. 16B and 16C are cross sectional views along D-D line shown in FIG. 16A.
Figure 16C:
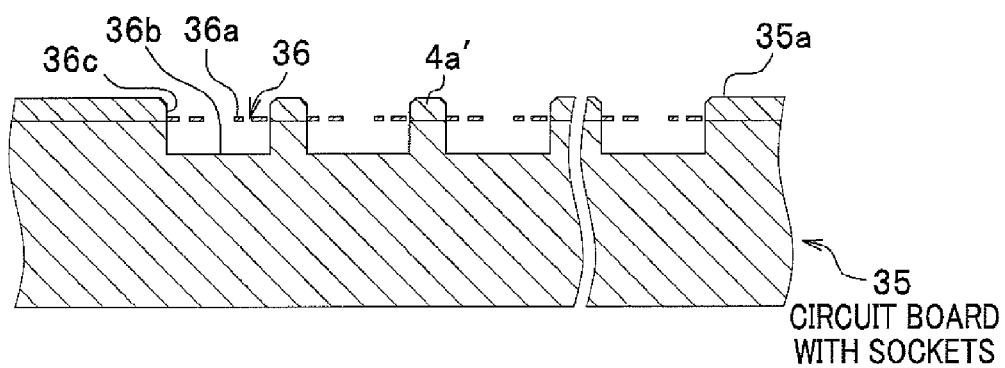
Figure 17:
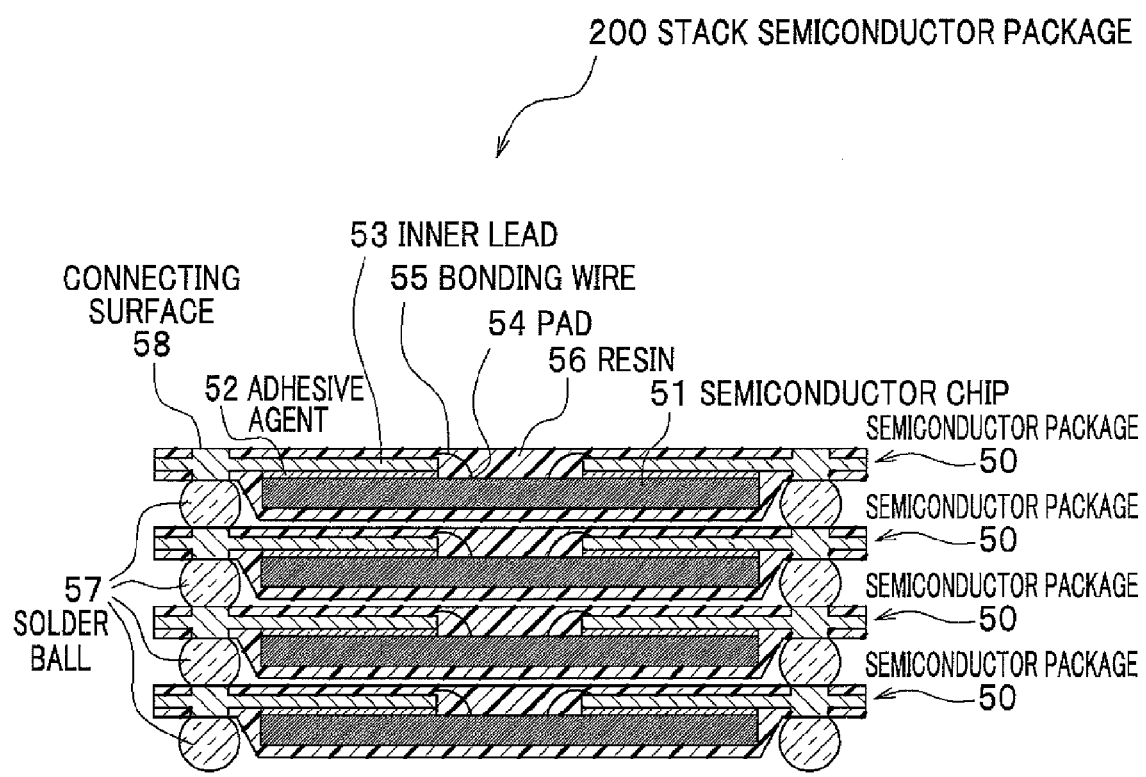
FIG. 17 is a structural drawing showing a structure of stacked semiconductor packages according to the prior art.

FIG. 16 is a view showing a circuit board with sockets. FIG. 16A is a plain view. FIGS. 16B and 16C are cross sectional views along C-C line shown in FIG. 16A. FIG. 16B shows a circuit board with sockets including conic spiral contacts. FIG. 16C shows a circuit board with sockets including horizontal spiral contacts.

As shown in FIGS. 16A and 16B, a circuit board with sockets 33 includes a socket 34 formed on the top surface 33a for enabling electrical conductivity. The socket 34 has a depressed shape and a spiral contact 34a is formed in the depression in conic shape projecting upward from the bottom of the depression 34c. Thus, the circuit board with sockets 33 is constructed.

In the circuit board 33 with sockets, the spiral contact 34a is formed in conic shape projecting upward from the bottom 31b of the depression 34c. The guide frame 4 is attached to the bottom of the spiral contact 34a and guides the connecting terminal 2 of the semiconductor package 3 shown in FIG. 2 for example.

As shown in FIG. 16C, a spiral contact 36a is formed horizontally at an opening of a depression☐blind via hole☐36c in a socket 36. The guide frame 4' is attached to upside of the opening of the depression 36c. With this configuration, the guide frame 4' guides the connecting terminal 2' of the semiconductor package 3' shown in FIG. 2 for example.

The constructions of a semiconductor package, semiconductor module, electronic circuit module, and a circuit board with sockets that have a socket function are now described.

As shown in FIG. 4, the connecting terminal 2 is soldered to the land 10a of the circuit board 10 by reflow soldering the connecting terminal 2 of the semiconductor package 22 located at the bottom of the semiconductor module 7a and the land 10a of the circuit board 10.

Another semiconductor package 22 is further stacked on the semiconductor package 22 in the condition that the semiconductor package 22 is soldered to the circuit board 10. At this time, the connecting terminal 2 of the semiconductor package 22 which is located an upper side is inserted into and electrically connected to the socket 1 of the semiconductor package 22 which is located a lower side. Similarly, yet another semiconductor package 22 is further stacked on the semiconductor package 22. Then, the c-shaped holding member is put on the semiconductor module 7a which is constructed, for example, by stacking three semiconductor packages as described above, and the ends 5a, 5b engage the depressions 3e, 3f provided on the bottom surface of the bottom semiconductor package 22. Thus, the electronic circuit module 11a wherein the three semiconductor packages are stacked is constructed. In this embodiment, the three semiconductor packages are stacked, however, more semiconductor packages may be further stacked. It is to be noted that only two semiconductor packages may be stacked, and only one semiconductor package may be mounted. When only one semiconductor package is mounted, the c-shaped holding member 5 is not necessary.

As shown in FIGS. 5A and 5B, the semiconductor package 3 is stacked on the sockets 6h of the relay board 6. The pin engaging portion 12bb provided at the lower end of the base 12b of the plate holding member 12 is inserted and soldered in the through hole 6f of the relay board 6. Then, the semiconductor package 3 is mounted along the base 12b which is fixed to the relay board 6. Further, a plurality of semiconductor packages 3 is stacked. After that, the upper lid 12a is put on. The engaging portion 12aa and the engaging portion 12ba are engaged to prevent the semiconductor package 3 from being displaced. Thus, the semiconductor module 7b wherein the semiconductor packages are electrically bonded to each other is constructed.

As shown in FIG. 6A, the semiconductor module 7c is constructed by placing the semiconductor package 8 at the bottom of the semiconductor module 7c. The relay connector 9 is provided on the bottom surface 8b of the semiconductor package 8. The spiral contact 9a of the relay connector 9 which is formed in conic shape and projecting downward is inserted into and electrically connected to the land 23a of the circuit board 23 along the depression 9c. Further, the semiconductor packages 3 are stacked to construct the semiconductor module 7c, and then the plate holding member 12' is put on the semiconductor module 7c to fix the semiconductor module 7c, whereby the electronic circuit module 11c shown in FIG. 6B is constructed.

As shown in FIG. 7, the connecting terminal 2 of the semiconductor package 24 is electrically connected to the land 25a of the circuit board 25 by reflow soldering. Two more semiconductor packages 24, 24 are further stacked on the semiconductor package 24. At this time, the connecting terminal 2 of the semiconductor package 24 is raised by spring-like force of the spiral contact 1a. Thus, the pin holding members 13 are inserted into the insertion holes 14☐14☐14 of the semiconductor packages 24 and the through holes 14f to press the three stacked semiconductor packages 24, 24, 24 a little and fix the three stacked semiconductor packages 24, 24, 24 to the circuit board 25.

Thus, the semiconductor module 7d is fixed to the circuit board 25, whereby the electronic circuit module 11d is constructed.

The description has been made above on the preferred embodiments; however, embodiments of the present invention are not limited to the above embodiments and may be modified as appropriate without deviating from the spirits of the invention.

For example, the engaging depression and protruding engaging portion that engage each other are applied to the typical construction of semiconductor modules; however, they may be applied to other constructions of semiconductor modules.

What is claimed is:

1. A semiconductor module comprising a plurality of the semiconductor packages, at least one of which is located at a bottom of the semiconductor module, that are stacked and electrically connected to each other;

a relay connector which is provided on a bottom of the semiconductor package and relays electric connection, and a substrate comprising a land terminal which is in contact with the relay connector and electrically connected to the relay connector on a top surface of the substrate, wherein the relay connector has a depressed shape and a spiral contact is formed in the depression in conic shape projecting upward from a bottom of the depression.

2. The semiconductor module according to claim 1, further comprising:

a connecting terminal which is provided on a bottom of the semiconductor package for enabling electrical conductivity; and a substrate comprising a depression which is electrically connected to the connecting terminal on a top surface of the substrate, wherein a spiral contact is formed in the depression in conic shape projecting upward from a bottom of the depression.

3. The semiconductor module according to claim 1, wherein a dissipating fin is attached via a metallic plate on at least one of a top surface and a side surface of the semiconductor module.

4. The semiconductor module according to claim 1, wherein a dissipating fan is attached to a top surface of the semiconductor module.

5. The semiconductor module according to claim 1, wherein a dissipating peltiert element is attached to a top surface of the semiconductor module.

* * * * *